United States Patent
Haba et al.

(10) Patent No.: US 8,975,738 B2
(45) Date of Patent: Mar. 10, 2015

(54) STRUCTURE FOR MICROELECTRONIC PACKAGING WITH TERMINALS ON DIELECTRIC MASS

(71) Applicant: Invensas Corporation, San Jose, CA (US)

(72) Inventors: Belgacem Haba, Saratoga, CA (US); Ilyas Mohammed, Santa Clara, CA (US)

(73) Assignee: Invensas Corporation, San Jose, CA (US)

(*) Notice: Subject to any disclaimer, the term of this patent is extended or adjusted under 35 U.S.C. 154(b) by 140 days.

(21) Appl. No.: 13/674,280

(22) Filed: Nov. 12, 2012

(65) Prior Publication Data

US 2014/0131851 A1 May 15, 2014

(51) Int. Cl.
*H01L 23/48* (2006.01)
*H01L 23/485* (2006.01)
(Continued)

(52) U.S. Cl.
CPC .............. *H01L 23/485* (2013.01); *H01L 24/02* (2013.01); *H01L 24/03* (2013.01); *H01L 21/565* (2013.01); *H01L 23/3128* (2013.01); *H01L 21/561* (2013.01)
USPC .................... 257/692; 257/690; 257/E23.001; 257/E23.014; 257/E23.021; 257/E23.031; 257/E23.032; 257/E23.033; 257/E23.034; 257/E23.035; 257/E23.036; 257/E23.042; 257/E23.043

(58) Field of Classification Search
USPC .................. 257/692, 690, E23.001, E23.014, 257/E23.021, E23.031, E23.032, E23.033, 257/E23.034, E23.035, E23.036, E23.042, 257/E23.04
See application file for complete search history.

(56) References Cited

U.S. PATENT DOCUMENTS 3,289,452 A 12/1966 Koellner
3,358,897 A 12/1967 Christensen
(Continued)

FOREIGN PATENT DOCUMENTS

CN 1641832 A 7/2005
CN 101449375 A 6/2009
(Continued)

OTHER PUBLICATIONS

International Seacrh Report and Written Opinion for Application No. PCT/US2012/060402 dated Apr. 2, 2013.
(Continued)

*Primary Examiner* — Timor Karimy
(74) *Attorney, Agent, or Firm* — Lerner, David, Littenberg, Krumholz & Mentlik, LLP

(57) ABSTRACT

A structure may include a spacer element overlying a first portion of a first surface of a substrate; first terminals at a second surface of the substrate opposite the first surface; and second terminals overlying a third surface of the spacer element facing away from the first surface. Traces extend from the second terminals along an edge surface of the spacer element that extends from the third surface towards the first surface, and may be electrically coupled between the second terminals and the first terminals or electrically conductive elements at the first surface. The spacer element may at least partially define a second portion of the first surface, which is other than the first portion and has an area sized to accommodate an entire area of a microelectronic element. Some of the conductive elements are at the second portion and may permit connection with such microelectronic element.

37 Claims, 9 Drawing Sheets

(51) Int. Cl.
*H01L 23/00* (2006.01)
*H01L 21/56* (2006.01)
*H01L 23/31* (2006.01)

(56) References Cited

U.S. PATENT DOCUMENTS

| | | |
|---|---|---|
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |

(56) References Cited

U.S. PATENT DOCUMENTS

| | | |
|---|---|---|
| 6,867,499 B1 | 3/2005 | Tabrizi |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,067,911 B1 | 6/2006 | Lin et al. |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,919,846 B2 | 4/2011 | Hembree |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,039,970 B2 | 10/2011 | Yamamori et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,278,746 B2 | 10/2012 | Ding et al. |
| 8,304,900 B2 | 11/2012 | Jang et al. |
| 8,314,492 B2 | 11/2012 | Egawa |
| 8,319,338 B1 | 11/2012 | Berry et al. |
| 8,525,318 B1 | 9/2013 | Kim et al. |
| 8,659,164 B2 | 2/2014 | Haba |
| 8,728,865 B2 | 5/2014 | Haba et al. |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0185735 A1 | 12/2002 | Sakurai et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2007/0015353 A1 | 1/2007 | Craig et al. |

(56) References Cited

U.S. PATENT DOCUMENTS

| | | |
|---|---|---|
| 2007/0090524 A1 | 4/2007 | Abbott |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0314748 A1 | 12/2010 | Hsu et al. |
| 2010/0327419 A1 | 12/2010 | Muthukumar et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0223721 A1 | 9/2011 | Cho et al. |
| 2011/0237027 A1 | 9/2011 | Kim et al. |
| 2011/0241193 A1 | 10/2011 | Ding et al. |
| 2011/0272449 A1 | 11/2011 | Pirkle et al. |
| 2012/0015481 A1 | 1/2012 | Kim |
| 2012/0018885 A1 | 1/2012 | Lee et al. |
| 2012/0043655 A1 | 2/2012 | Khor et al. |
| 2012/0061814 A1 | 3/2012 | Camacho et al. |
| 2012/0063090 A1 | 3/2012 | Hsiao et al. |
| 2012/0086130 A1 | 4/2012 | Sasaki et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280386 A1 | 11/2012 | Sato et al. |
| 2013/0049221 A1 | 2/2013 | Han et al. |
| 2013/0069222 A1 | 3/2013 | Camacho |
| 2014/0036454 A1 | 2/2014 | Caskey et al. |

FOREIGN PATENT DOCUMENTS

| | | |
|---|---|---|
| CN | 101675516 A | 3/2010 |
| CN | 102324418 A | 1/2012 |
| EP | 920058 | 6/1999 |
| EP | 1449414 A1 | 8/2004 |
| EP | 2234158 A1 | 9/2010 |
| JP | 61125062 A | 6/1986 |
| JP | 62-226307 | 10/1987 |
| JP | 1012769 A | 1/1989 |
| JP | 64-71162 | 3/1989 |
| JP | 62-68015 A | 9/1994 |
| JP | 07-122787 A | 5/1995 |
| JP | 09505439 | 5/1997 |
| JP | 11-074295 A | 3/1999 |
| JP | 11135663 A | 5/1999 |
| JP | 11251350 A | 9/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2005175019 A | 6/2005 |
| JP | 2003426392 A | 7/2005 |

(56) References Cited

FOREIGN PATENT DOCUMENTS

| | | |
|---|---|---|
| JP | 2005183880 A | 7/2005 |
| JP | 2005183923 A | 7/2005 |
| JP | 2005203497 A | 7/2005 |
| JP | 2005302765 A | 10/2005 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| TW | 200810079 A | 2/2008 |
| TW | 200933760 A | 8/2009 |
| TW | 201023277 A | 6/2010 |
| WO | 02/13256 A1 | 2/2002 |
| WO | 03045123 A1 | 5/2003 |
| WO | 2006050691 A2 | 5/2006 |
| WO | 2008065896 A1 | 6/2008 |
| WO | 2008120755 A1 | 10/2008 |
| WO | 2010101163 A1 | 9/2010 |

OTHER PUBLICATIONS

"EE Times Asia" [online]. [Retrieved Aug. 5, 2010]. Retrieved from internet. <http://www.eetasia.com/ART_8800428222_480300_nt_dec52276.HTM>, 4 pages.

"Wafer Level Stack—WDoD", [online]. [Retrieved Aug. 5, 2010]. Retrieved from the internet. <http://www.3d-plus.com/techno-wafer-level-stack-wdod.php>, 2 pages.

International Search Report and Written Opinion for PCT/US2011/060551 dated Apr. 18, 2012.

Redistributed Chip Package (RCP) Technology, Freescale Semiconductor, 2005, 6 pages.

Search Report from Korean Patent Applicatin No. 10-2010-0113271 dated Jan. 12, 2011.

Yoon, PhD, Seung Wook, "Next Generation Wafer Level Packaging Solution for 3D integration," May 2010, STATS ChipPAC Ltd.

Extended European Search Report for Application No. EP13162975 dated Sep. 5, 2013.

International Search Report and Written Opinion for Application No. PCT/US2013/041981 dated Nov. 13, 2013.

International Search Report and Written Opinion for Application No. PCT/US2013/052883 dated Oct. 21, 2013.

International Search Report and Written Opinion for Application No. PCT/US2013/053437 dated Nov. 25, 2013.

Japanese Office Action for Application No. 2013-509325 dated Oct. 18, 2013.

Office Action for Taiwan Application No. 100125521 dated Dec. 20, 2013.

Office Action from U.S. Appl. No. 12/769,930 mailed May 5, 2011.

Bang, U.S. Appl. No. 10/656,534, filed Sep. 5, 2003.

International Search Report and Written Opinion for Application No. PCT/US2011/044346 dated May 11, 2012.

International Search Report and Written Opinion PCT/US2011/044342 dated May 7, 2012.

International Search Report Application No. PCT/US2011/024143, dated Sep. 14, 2011.

International Search Report, PCT/US2005/039716, Apr. 5, 2006.

Kim et al., "Application of Through Mold Via (TMV) as PoP base package", 6 pages (2008).

Kim, et al., Application of Through Mold Via (TMV) as PoP base package, ECTC, 2008.

Korean Office Action for Application No. 10-2011-0041843 dated Jun. 20, 2011.

Korean Search Report KR10-2011-0041843 dated Feb. 24, 2011.

Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.

North Corporation, "Processed Intra-layer Interconnection Material for PWBs [Etched Copper Bump with Copper Foil]," NMBITM, Version 2001.6.

Partial International Search Report from Invitation to Pay Additional Fees for Application No. PCT/US2012/028738 dated Jun. 6, 2012.

Office Action from Taiwan for Application No. 100125522 dated Jan. 27, 2014.

Partial International Search Report for Application No. PCT/US2013/075672 dated Mar. 12, 2014.

Taiwanese Office Action for Application No. 100141695 dated Mar. 19, 2014.

International Search Report and Written Opinion for Application No. PCT/US2013/075672 dated Apr. 22, 2014.

Partial International Search Report for Application No. PCT/US2013/026126 dated Jun. 17, 2013.

Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).

Partial International Search Report for Application No. PCT/US2012/060402 dated Feb. 21, 2013.

Jin, Yonggang et al., "STM 3D-IC Package and 3D eWLB Development," STMicroelectronics Singapore/STMicroelectronics France May 21, 2010.

Chinese Office Action for Application No. 201180022247.8 dated Sep. 16, 2014.

Taiwan Office Action for Application No. 101138311 dated Jun. 27, 2014.

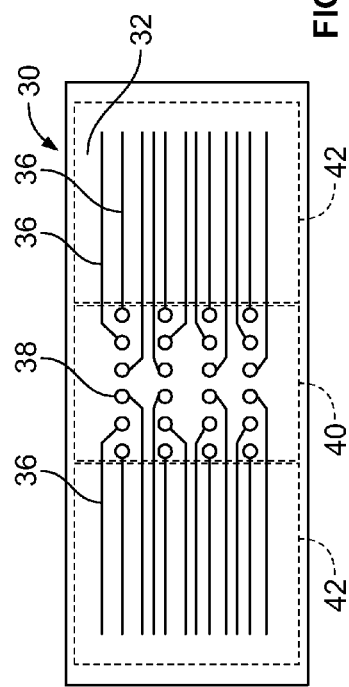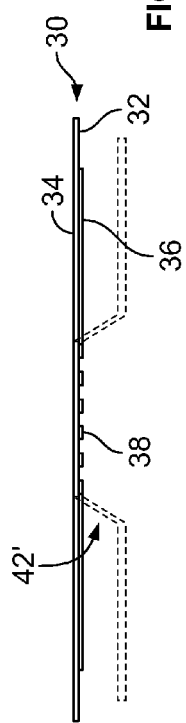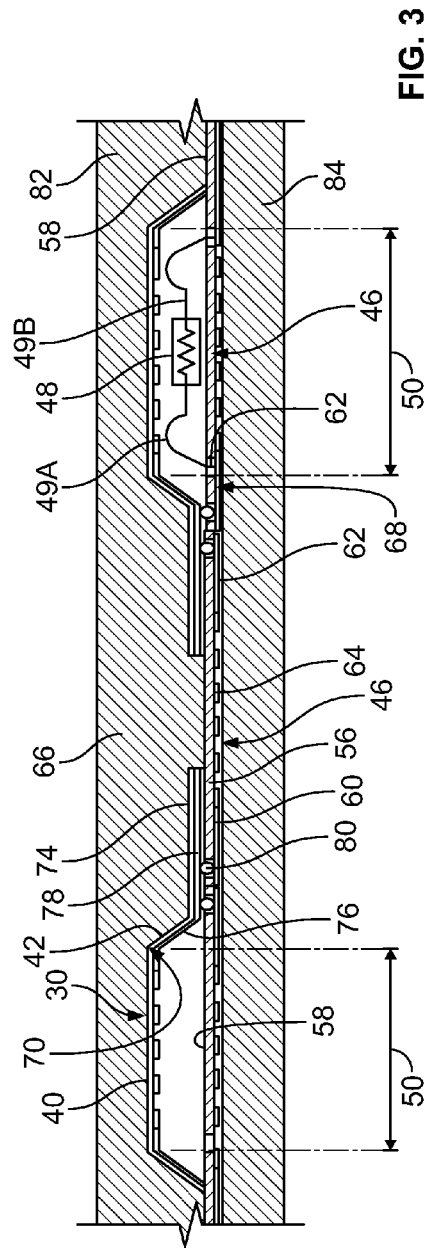

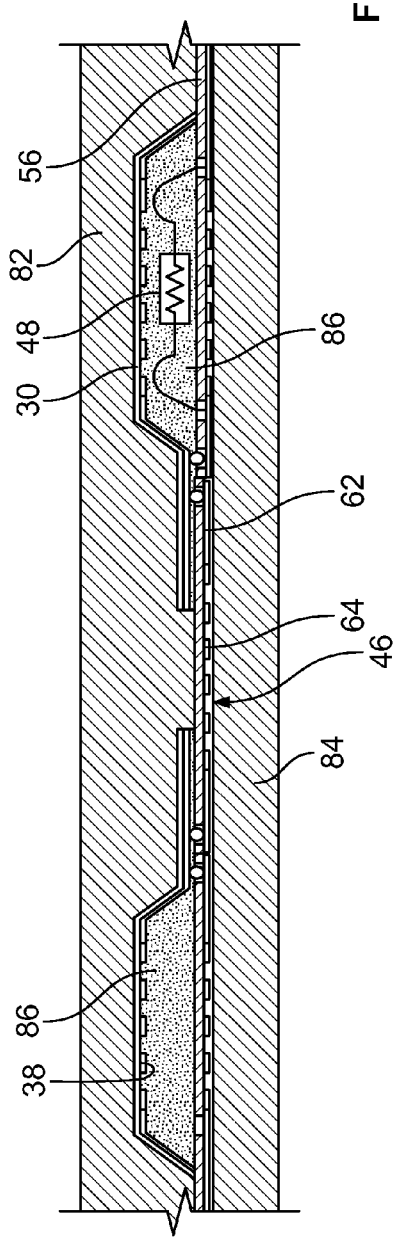
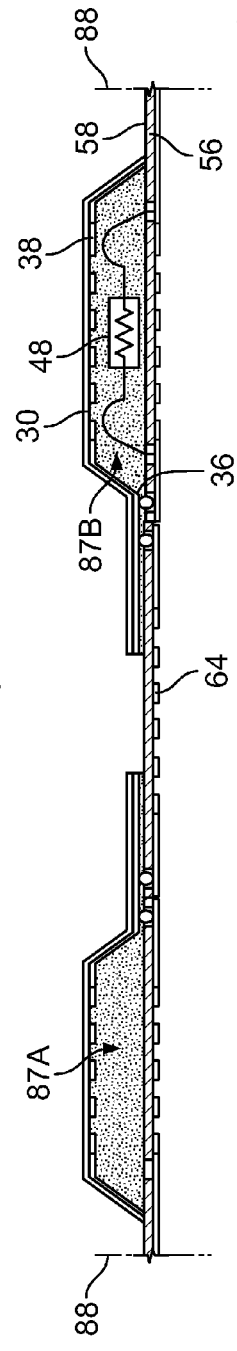
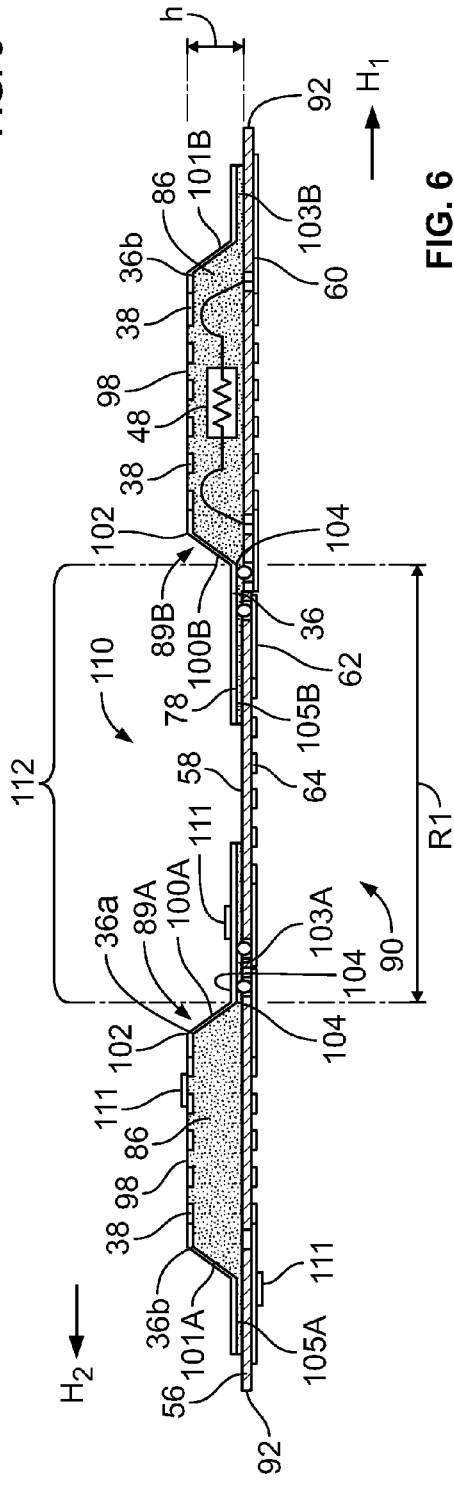

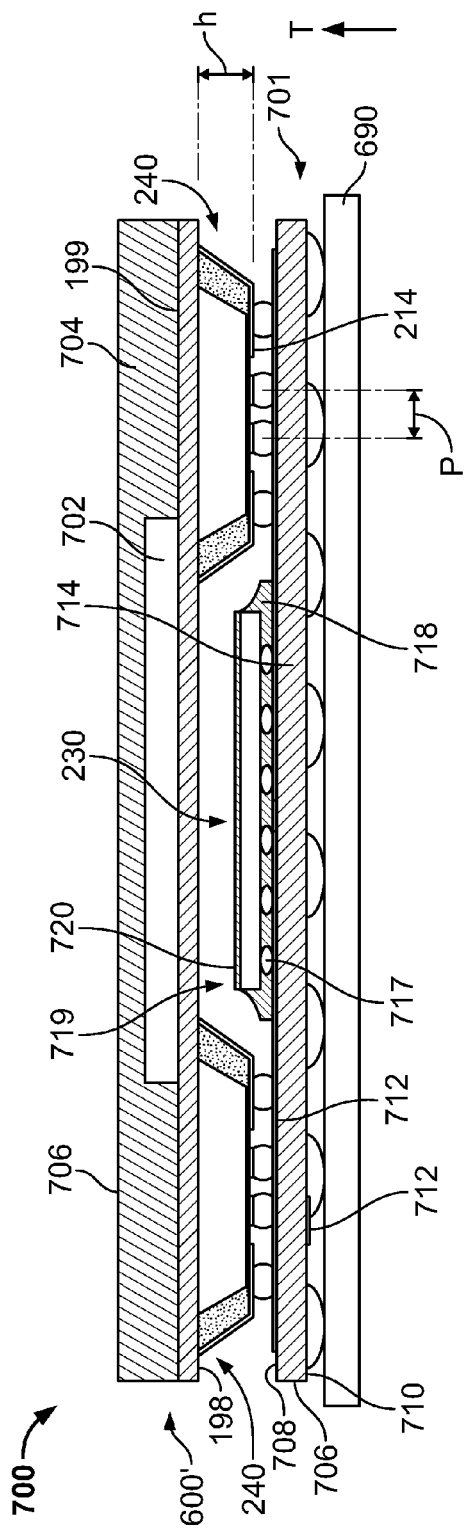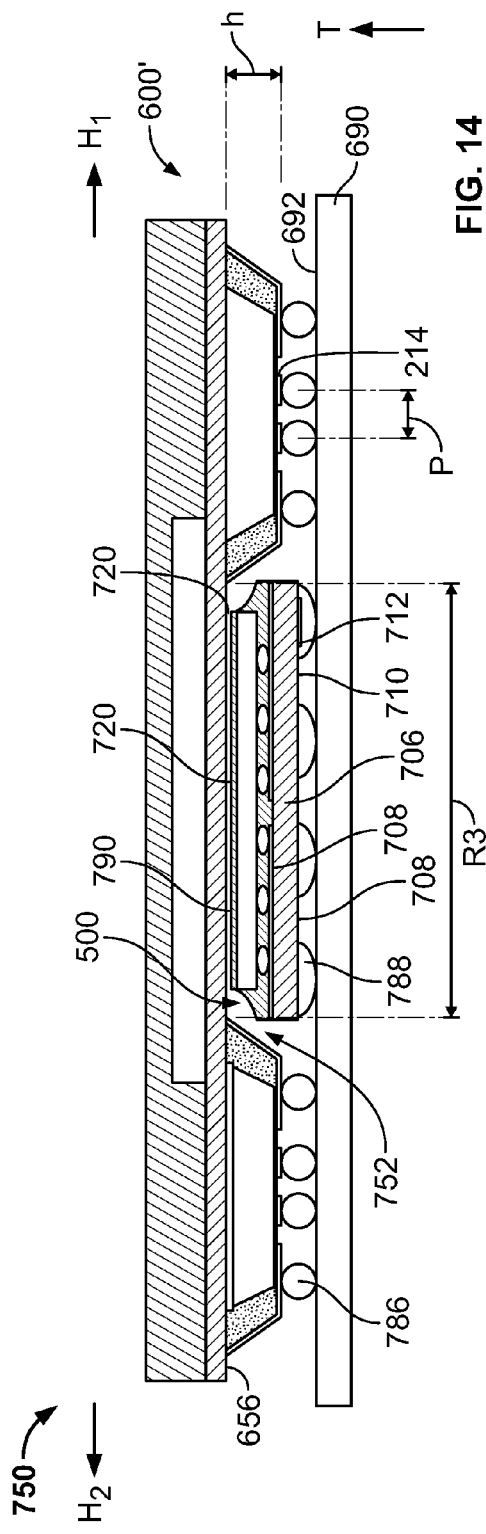

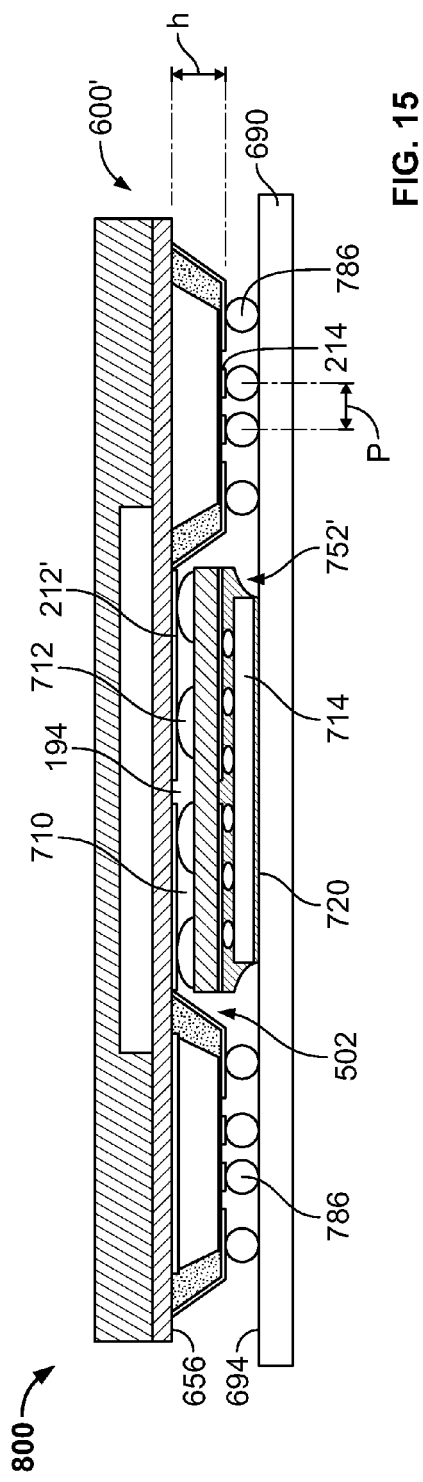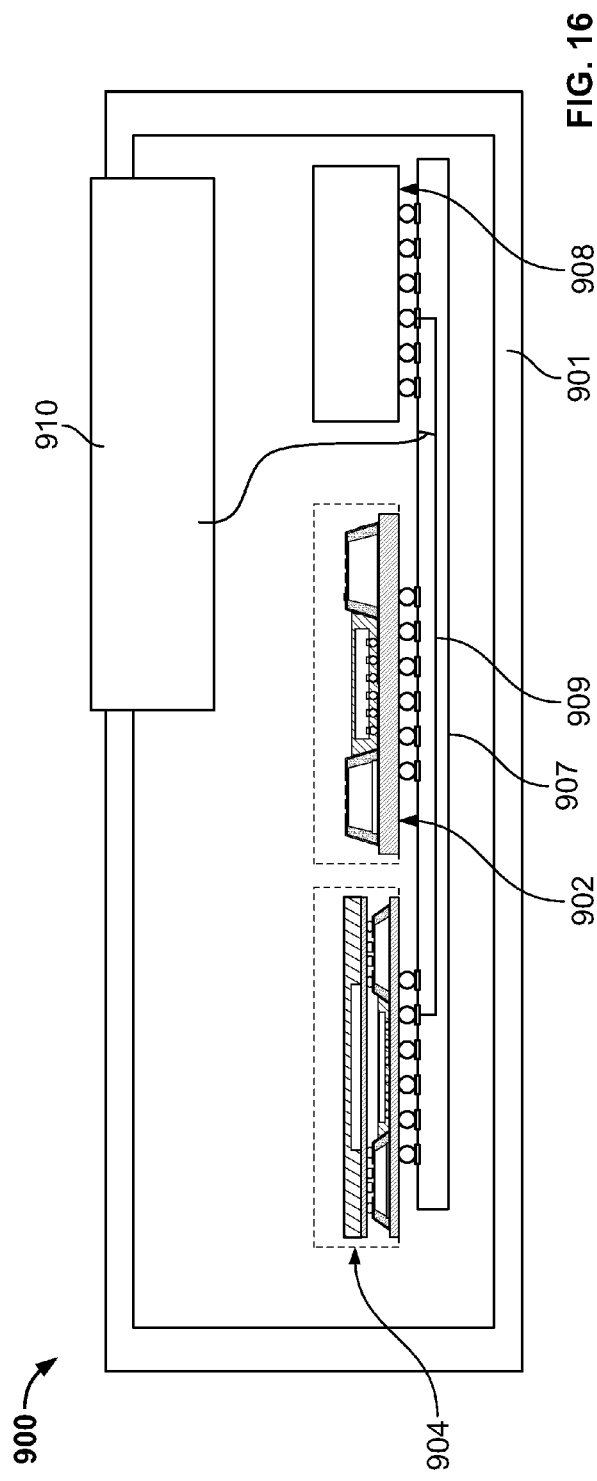

STRUCTURE FOR MICROELECTRONIC PACKAGING WITH TERMINALS ON DIELECTRIC MASS

FIELD OF THE INVENTION

The present invention relates to structures for microelectronic packaging.

BACKGROUND OF THE INVENTION

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts at the front surface. The contacts are electrically connected to the numerous electronic circuit elements formed integrally within the chip. Such a chip most commonly is provided in a package having a miniature circuit panel referred to as a substrate. The chip is typically mounted to the substrate with the front or rear surface overlying a surface of the substrate, and the substrate typically has terminals at a surface of the substrate. The terminals are electrically connected to the contacts of the chip. The package typically also includes some form of covering overlying the chip on the side of the chip opposite from the substrate. The covering serves to protect the chip and, in some cases, the connections between the chip and the conductive elements of the substrate. Such a packaged chip can be mounted to a circuit panel such as a circuit board by connecting the terminals of the substrate to conductive elements such as contact pads on the larger circuit panel.

In certain packages, the chip is mounted with its front or back surface overlying an upper surface of the substrate, whereas terminals are provided on the oppositely facing lower surface. A mass of a dielectric material overlies the chip and, most typically, the electrical connections between the chip and the conductive elements of the substrate. The dielectric mass can be formed by molding a flowable dielectric composition around the chip so that the dielectric composition covers the chip and all or part of the top surface of the substrate. Such a package is commonly referred to as an "overmolded" package, and the mass of dielectric material is referred to as the "overmold." Overmolded packages are economical to manufacture and thus are widely used.

In some applications, it is desirable to stack chip packages on top of one another, so that plural chips can be provided in the same space on the surface of the larger circuit panel. Also, it is desirable to have a large number of input/output interconnections to the chips. Certain overmolded packages incorporate stacking contacts at the top surface of the substrate outside of the area covered by the chip and, typically, outside of the area covered by the overmold. Such packages can be stacked one atop the other with interconnecting elements such as solder balls or other conductive connections extending between the stacking contacts of the lower package and the terminals of the next higher package in the stack. In such an arrangement, all of the packages in the stack are electrically connected to the terminals on package at the bottom of the stack. In such an arrangement, however, all of the interconnecting elements must be accommodated in the limited region of the substrate outside of the area covered by the overmold. Moreover, because the substrate of the higher package in the stack sits above the dielectric overmold in the next lower package, there is an appreciable gap in the vertical direction between the terminals of the higher package and the stacking contacts of the lower package. The interconnecting elements must bridge this gap. This typically requires interconnecting elements spaced at relatively large intervals. Therefore, the number of interconnecting elements which can be accommodated using package substrate of a given size is limited.

Despite the considerable effort devoted in the art to development of stackable packages and other packages having top-surface mounting pads, further improvement would be desirable.

SUMMARY OF THE INVENTION

In accordance with one embodiment, a structure may include a substrate having first and second oppositely facing surfaces, a plurality of electrically conductive elements at the first surface, and a plurality of first terminals at the second surface configured for connection to a first component, at least some of the first terminals electrically connected with the conductive elements; a spacer element overlying a first portion of the first surface, the spacer element having a third surface facing away from the first surface and an edge surface extending from the third surface towards the first surface; a plurality of second terminals overlying the third surface and overlying the first surface, the second terminals configured for connection to a second component; and a plurality of traces electrically coupled between the second terminals and at least one of the electrically conductive elements or the first terminals, the traces extending from the second terminals along the edge surface, where the spacer element at least partially defines a second portion of the first surface, the second portion being other than the first portion of the first surface and having an area sized to accommodate an entire area of a microelectronic element, and at least some of the conductive elements at the first surface are at the second portion and configured to permit connection with such microelectronic element.

In another embodiment, a structure may include a substrate having first and second oppositely facing surfaces, and a plurality of electrically conductive elements at the first surface; a spacer element overlying a first portion of the second surface and having a third surface facing away from the second surface of the substrate and an edge surface extending from the third surface towards the second surface; a plurality of terminals overlying the third surface and overlying the second surface of the substrate, the terminals configured for connection to a component; and a plurality of traces electrically coupled between the terminals and the conductive elements, the traces extending from the terminals along the edge surfaces, where the spacer element at least partially defines a second portion of the second surface, the second portion being other than the first portion of the second surface and having an area sized to accommodate an entire area of a microelectronic element.

In another embodiment, a package assembly may include a structure having a substrate having first and second oppositely facing surfaces, a plurality of electrically conductive elements at the first surface and a plurality of first terminals at the second surface configured for connection to a first component, at least some of the first terminals electrically connected with the conductive elements; a first dielectric mass disposed over a first portion of the first surface, the first dielectric mass having a third surface facing away from the first surface and a first edge surface extending from the third surface towards the first surface; a plurality of second terminals overlying the third surface and the first surface, the second terminals configured for connection to a second component; and a plurality of traces electrically coupled between the second terminals and at least one of the electrically conductive elements or the first terminals, the traces extending from the second terminals along the first edge surface, where the first dielectric mass at least partially defines a second portion of the first surface, the second portion being other than the first portion of the first surface and having an area sized to accommodate an entire area of a microelectronic element. The package assembly may further include a second dielectric mass overlying at least a part of the second portion of the first surface, the second dielectric mass having a fourth surface remote from and facing away from the first surface, at least a part of the fourth surface extending over the second portion of the first surface toward the first dielectric mass, the second dielectric mass having a second edge surface facing at least a part of the first edge surface, and the first traces extending between the first and second edge surfaces, and where the second dielectric mass is other than the first dielectric mass.

In another embodiment, a method of making a structure may include positioning a sheet bearing a plurality of traces over a first surface of a substrate, where the substrate has a second surface facing opposite to the first surface, a plurality of electrically conductive elements at the first surface, and a plurality of first terminals at the second surface configured for connection to a first component, at least some of the first terminals electrically connected with the conductive elements; introducing a flowable composition between the sheet and the first surface of the substrate, and curing the composition to form an overmold overlying a first portion of the first surface, having a shape at least partially defined by the sheet and including a third surface facing away from the first surface and an edge surface extending from the third surface towards the first surface; and removing the sheet so as to leave the traces extending along the edge surface and electrically coupled to at least one of the electrically conductive elements or the first terminals, where the overmold at least partially defines a second portion of the first surface, the second portion being other than the first portion of the first surface and having an area sized to accommodate an entire area of a microelectronic element, and at least some of the conductive elements at the first surface are at the second portion and configured to permit connection with such microelectronic element.

In another embodiment, a method of making a structure may include positioning a sheet bearing a plurality of traces over a first surface of a substrate, where the substrate has a second surface opposite to the first surface, a plurality of electrically conductive elements at the first surface, and a plurality of first terminals at the second surface configured for connection to a first component, at least some of the first terminals electrically connected with the conductive elements with conductive elements. The positioning step may be performed so that a first portion of the sheet and first portions of the traces on the first portion of the sheet extend over the first surface of the substrate and a second portion of the sheet and second portions of the traces on the second portion of the sheet extend from the first portion toward the first surface of the substrate. The method may further include introducing a flowable composition between the sheet and the first surface of the substrate; and curing the composition to form an overmold overlying a first portion of the first surface and having a shape at least partially defined by the sheet and including a third surface facing away from the first surface and an edge surface extending from the third surface towards the first surface, the traces extending along the edge surface, the second portions of the traces being electrically connected with at least one of the conductive elements or the first terminals of the substrate, where the overmold at least partially defines a second portion of the first surface, the second portion being other than the first portion of the first surface and having an area sized to accommodate an entire area of a microelectronic element.

In another embodiment, a method of making a structure may include depositing a conformal dielectric layer onto a first surface of a substrate, where the substrate has a second surface facing opposite to the first surface, a plurality of electrically conductive elements at the first surface, and a plurality of first terminals at the second surface configured for connection to a first component, at least some of the first terminals electrically connected with the conductive elements. The depositing step may be performed so that a first portion of the conformal layer facing away from the first surface defines a third surface facing away from the first surface and one or more additional portions define one or more edge surfaces extending from the third surface towards the first surface. The method may further include providing traces and second terminals on the conformal layer so that the second terminals overlie the third surface and overlie the first surface, the second terminals configured for connection to a second component, and the traces extend along the edge surface, the traces being electrically coupled to at least one of the electrically conductive elements or the first terminals; and where the conformal layer at least partially defines a second portion of the first surface, the second portion being other than the first portion of the first surface and having an area sized to accommodate an entire area of a microelectronic element.

BRIEF DESCRIPTION OF THE DRAWINGS

FIG. 1 is a diagrammatic bottom plan view of a component used in a method of manufacturing a package according to one embodiment of the invention.

FIG. 2 is a diagrammatic elevational view of the component depicted in FIG. 1.

FIG. 3 is a diagrammatic sectional view depicting a manufacturing step using the component of FIGS. 1 and 2.

FIG. 4 is a diagrammatic sectional view similar to FIG. 3, but depicting the component and associated elements at a later stage in the manufacturing process.

FIG. 5 is a diagrammatic sectional view similar to FIGS. 3 and 4, depicting the component and associated elements at a later stage in the manufacturing operation.

FIG. 6 is a diagrammatic sectional view depicting a structure made using the manufacturing process of FIGS. 3-5.

FIG. 13 is a diagrammatic sectional view of an exemplary package assembly, in accordance with the disclosure.

FIG. 14 is a diagrammatic sectional view of another exemplary package assembly, in accordance with the disclosure.

FIG. 15 is a diagrammatic sectional view of an exemplary package assembly, in accordance with the disclosure.

FIG. 16 is a diagrammatic view depicting a system according with the disclosure.

DETAILED DESCRIPTION

Figure 7A:
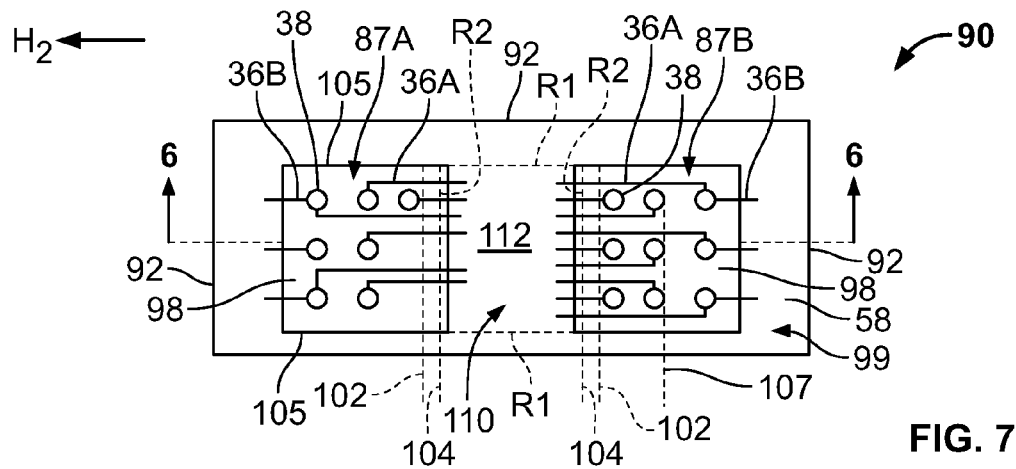
FIG. 7A is a diagrammatic top plan view depicting the structure of FIG. 6.

A component utilized in a manufacturing process according to one embodiment of the invention incorporates a carrier in the form of a metallic sheet 30 as, for example, a sheet of copper (FIGS. 1 and 2) having a first surface 32 and an opposite second surface 34. The first surface 32 bears a plurality of electrically conductive traces 36. The traces are formed as elongated strips of a conductive material, preferably a solid metal such as copper, gold, nickel, and combinations thereof on the first surface 32 of sheet 30. The traces are formed integrally with terminals 38 of similar composition. The terminals are disposed in a first portion 40 of the sheet, schematically indicated by a broken line. The traces extend from the terminals into a second portion 42. In this embodiment, second portion 42 includes regions on opposite sides of the first portion 40. Although only a few terminals 38 and a few traces 36 are depicted in FIGS. 1 and 2, in practice, there can be hundreds or more terminals and traces.

Terminals 38 are disposed in an "area array" within first portion 40. As used in this disclosure, the term "area array" means an array of terminals in which the terminals are substantially dispersed over a two-dimensional region, rather than concentrated in a few rows such as rows only at the perimeter of the region or rows only in the center of the region. Although the particular area array shown in FIG. 1 is a rectilinear, uniform array, this is not essential.

The terminals and traces can be fabricated by numerous known metal working methods as, for example, by etching a sheet originally having a thickness greater than sheet 30 so as to remove metal from areas other than those occupied by the terminals and traces, or by plating the terminals and traces onto the sheet. FIGS. 1 and 2 depict only a single sheet of a size suitable for making a single structure that can accommodate a microelectronic element over a defined portion of a substrate forming the structure, as described in detail below. In practice, however, the sheet desirably is provided as a continuous or semi-continuous element incorporating numerous portions, each such portion constituting the sheet shown in FIGS. 1 and 2, these portions being continuous with one another.

The sheet according to FIGS. 1 and 2 is utilized in conjunction with a structure 46 (FIG. 3) optionally incorporating a passive element 48, such as a resistor, inductor or capacitor, having leads 49A, 49B extending therefrom. Structure 46 also includes a substrate in the form of a small circuit panel incorporating a generally planar dielectric structure 56 having a top surface 58 and an oppositely facing bottom surface 60. The words "top" and "bottom" as used herein refer to the frame of reference of the elements discussed and do not refer to the normal gravitational frame of reference. The substrate 56 also includes conductive elements which, in this instance, incorporate traces 62 extending on the bottom surface 60 and terminals 64 also at the bottom surface of the substrate 56 and connected to traces 62. The substrate may include silicon or a material having a maximum coefficient of thermal expansion of 12.

In addition, the leads 49A and 49b are connected with traces 62 on the substrate. The substrate has apertures 68 arranged so that traces 62 are at the upper surface of the substrate overlying the apertures 68. In a particular embodiment, the substrates of numerous structures are provided as a continuous or semi-continuous element such as a strip, tape or sheet, although in FIG. 3 there are no visible borders between the individual substrates 56. The apertures 68 in the substrate 56 desirably are fully closed by the traces 62. Likewise, the apertures where the leads 49 penetrate to the traces desirably are fully covered by the traces, so that the substrate is a continuous, impervious sheet.

In a step of the method, the element including numerous carriers or sheets 30 is positioned over the element including numerous structures 46 with their substrates and optional passive elements. Each carrier or sheet 30 is positioned so that the first surface 32 bearing traces 36 and terminals 38 faces toward the substrates. In the embodiment of FIG. 3, the positioning step includes deforming each carrier sheet 30 from the flat condition depicted in FIGS. 1 and 2 to a deformed condition in which the second portion 42 of each sheet is bent out of plane from the first portion 40, with the second portion 42 projecting in the direction of first surface 32 as indicated schematically at 42' in FIG. 2. This may be done by essentially any conventional forming technology as, for example, by use of a matched metal die in a stamping press. The formed carrier sheets are positioned over the structures and substrates optionally with passive elements thereover so that the first portion 40 of the carrier sheet 30 (FIG. 1) bearing terminals 38 extends over a first portion 50 of the upper surface 58 of the substrate 56 microelectronic element or chip 48 and the second portion 42 extends from the first portion 40 toward the substrate 56.

In this condition, the second portions 42 of the each carrier sheet 30 define sloping regions 70 extending from the first portion 40 of the sheet, and also define flange regions 74 projecting from the sloping regions 70. The traces in the second portions 42 extend along the sloping regions 70 and also extend along the flange regions 74. Thus, those portions of the traces 36 in the second portions 42 of the sheet include slope portions 76 extending along the sloping regions 70 and bottom portions 78 extending on the flange portions 74.

With the carrier sheets 30 positioned over the structure 46, the bottom portions 78 of the traces 36 and the flange regions 74 of the sheet are disposed close to the substrate 56. The bottom portions 78 of the traces on the sheet are connected to the traces 62 on the substrate by any suitable connection as, for example, by solder bonds 80. The positions of the traces on the carrier sheet 30 and the positions of the conductive features on the substrate 56 can be controlled with excellent accuracy. This facilitates the bonding process and facilitates the use of small-diameter bonds which allow close spacing of the traces.

After the traces on the carrier sheets have been bonded to the traces on the substrates, the assembled parts are placed into a mold, so that a first side 82 of the mold supports the carrier sheets 30, whereas a second side 84 of the mold supports the structures 46. Although the mold parts are depicted as closely overlying the carrier sheets and structures, there is no need for sealing engagement between the mold parts and the carrier sheets 30 or the structures 46. Rather, the mold parts serve to physically support the carrier sheets and structures and prevent distortion of these elements during the molding step discussed below.

In the next step (FIG. 4), a flowable composition as, for example, an epoxy is introduced into the space between each carrier sheet 30 and the associated structure 46 and around the optional passive element 48 on the structure. This flowable composition, which may include metal material, is cured to form an overmold 86 (FIG. 4). As the flowable composition is introduced, it contacts the carrier sheet and thus assumes a shape defined at least partially by the carrier sheet. Also, the flowable composition flows into intimate contact with the traces and terminals and partially surrounds the traces and terminals. In addition, the flowable composition flows into contact with the leads 49 and the passive element 48, and surrounds the leads 49 and any uncovered portions of the passive element. However, because the carrier sheet 30 is in intimate contact with the surfaces of the traces and, particularly, the terminals 38, the faces of the terminals facing toward the carrier sheet are fully protected from contact with the flowable composition. Also, the substrate 56 protects the terminals 64 on the substrate 56 from contamination by the flowable composition. Because the carrier sheets 30 and substrates 56 are provided as continuous or semi-continuous sheets, there is no need for the mold parts to confine the flowable composition at the margins of any one particular carrier sheet or substrate. The flowable composition may be introduced into the space between one carrier sheet and substrate and may flow into the spaces between other carrier sheets and substrates.

In the next phase of the process, the mold elements 82 and 84 are removed, leaving the carrier sheets 30 exposed on one side of the structures 46 with dielectric masses 87A and 87B formed from the flowable composition of dielectric material, with the dielectric mass 87B including the optional passive element 48, on the surface 58 of the substrate and leaving the terminals 64 on the structures exposed on the opposite side (FIG. 5). In the next phase of the process, the carrier sheets 30 are removed as, for example, by exposing the carrier sheets to an etchant which is effective to remove the carrier sheet but which leaves the terminals 38 and traces 36 substantially intact. After etching, the structures 46 are then severed along lines of separation 88 (only one of the structures 46 is shown in FIG. 5) to yield an individual structure 90 having the configuration illustrated in FIG. 6.

The structure 90 includes the dielectric masses 87A and 87B as spacer elements 89A and 89B, respectively. Also referring to FIG. 7A, the upper surface 58 and the lower surface 60 of the substrate 56 of the structure 90 extend in horizontal directions $H_1$ and $H_2$ and edges 92 of the structure 90 extend between the upper and lower surfaces. Each of the spacer elements has a thickness (h) extending away from the surface 58 in direction orthogonal to the horizontal directions. The structure 90 also has electrically conductive elements including the traces 62 and terminals 64 at the lower surface 60. In the structure 90, terminals 64 are referred to as "bottom terminals."

As used in this disclosure, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In addition, as used in this disclosure a statement that an electrically conductive element is "at" a surface of a circuit panel, a microelectronic element such as a semiconductor chip or a like element, indicates that, when the panel or the element is not assembled with any other element, the electrically conductive element is available for contact with a theoretical point moving in a direction perpendicular to the surface of the panel or element toward the surface of the panel or element from outside the panel or element.

In the particular embodiment illustrated, bottom terminals 64 are disposed on the lower surface 60 so that the bottom terminals project slightly from the lower surface. However, the bottom terminals can be disposed at the lower surface, even if the bottom terminals are embedded in the substrate 56 or disposed on the top surface 58 of the substrate, provided that there are openings in the substrate which allow access.

The structure 90 also includes the spacer element 89A, which is a dielectric mass formed from the cured flowable epoxy, covering a portion of the upper surface 58 of the substrate, and the spacer element 89B, which is a dielectric mass formed from the flowable epoxy that is displaced laterally from the spacer element 89A and containing the passive element 48 with the leads 49 electrically connected to the conductive elements, particularly traces 62 and bottom terminals 64 on the substrate, covering a portion of the upper surface 58.

The spacer elements 89 each define a top surface 98 remote from the substrate 56. For the spacer element 89B, at least a part of the top surface 98 extends over the passive element 48 and the leads 49. Mass or overmold 86 forming the spacer elements 89A and 89B also define first edge surfaces 100A and 100B, respectively, extending downwardly from a top border 102 adjacent the top surface 98 to a bottom border 104 adjacent the substrate 56 and disposed inside the edges 92 of the substrate. That is, bottom border 104 is disposed within horizontal area 99 bounded by the edges 92 of the substrate. The first edge surface 100A slopes away from the spacer element 89A in the first horizontal direction $H_1$ (FIGS. 6 and 7A), at an incline of less than 90 degrees with respect to the top surface 98, so that the bottom border 104 of the first edge surface 100A is further from the top surface 98 than the top border 102 in the horizontal direction $H_1$. The first edge surface 100A is shaped such that any straight line extending along the first edge surface 100A at a constant vertical distance from substrate 56 is disposed at a constant location in the first horizontal direction $H_1$. For example, an imaginary line 107 (FIG. 7A) extending at a constant vertical distance from the substrate would also lie at a constant horizontal location. In the particular embodiment shown, the first edge surface 100A is substantially planar.

The first edge surface 100B slopes away from the spacer element 89B in the horizontal direction $H_2$ (FIGS. 6 and 7A), so that the bottom border 104 of the first edge surface 100B is further from the passive element 48 than the top border 98 in the horizontal direction $H_2$. The first edge surface 100B is shaped such that any straight line extending along the first edge surface 100B at a constant vertical distance from substrate 56 is disposed at a constant location in the horizontal direction $H_2$, similarly as described above for the first edge surface 100A. In the particular embodiment shown, the first edge surface 100B is substantially planar.

Mass or overmold 86 forming the spacer elements 89A and 89B further include second edge surfaces 101A and 101B, respectively, extending downwardly from the top surface 98 thereof and sloping away in the horizontal directions $H_2$ and $H_1$. Similar to the edge surfaces 100, the edge surfaces 101A and 101B are shaped such that any straight line extending along the surfaces 101A and 101B at a constant vertical distance from substrate 56 is disposed at a constant location in the horizontal directions $H_2$ and $H_1$, respectively, similarly as described above for the first edge surfaces 100A and 100B.

Figure 8:
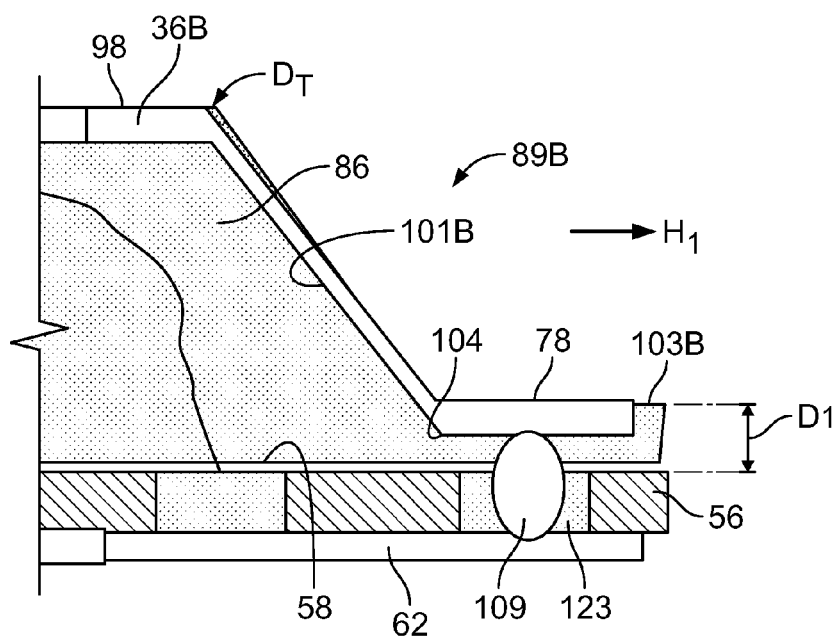
FIG. 8 is a fragmentary sectional view on an enlarged scale showing a portion of an exemplary structure made using the manufacturing process of FIGS. 3-5.

As best seen in FIG. 8, for each of the spacer elements 89, the dielectric mass or overmold may further define first flange surfaces 103 and 105 facing upwardly, away from the substrate 56. For example, referring to FIG. 8 for the spacer element 89B, first flange surface 103B extends in the first horizontal direction $H_1$, away from bottom border 104 of the first edge surface 101B. The first flange surface 103B is disposed adjacent the substrate 56. The distance $D_1$ between the first flange surface 103B and the top surface 58 of the substrate is considerably less than the distance $D_T$ between the top surface 98 of the dielectric mass and the top surface 58 of the substrate. Similarly, referring to FIG. 6, a second flange surface 105B extends from the bottom border 104 of the second edge surface 100B in the second horizontal direction $H_2$. The spacer element 89A, similar to the spacer element 89B, may include a first flange surface 103A and a second flange surface 105A extending away from the bottom borders 102 of the edge surfaces 100A and 101A, respectively, in the horizontal directions $H_1$ and $H_2$.

As shown in FIGS. 6 and 7A, terminals 38 are at the top surface 98 of the spacer elements 89 of the structure 90. A plurality of traces 36a extend along top surface 98 from some of the top terminals 38, and further extend across top border 102 and continuously along the first edge surfaces 100 of the spacer elements. Those portions of the traces extending along the first edge surfaces 100A are substantially parallel to one another, and those portions of the traces extending along the first edge surfaces 100B are substantially parallel to one another. The traces associated with the spacer elements 89A and 89B may include bottom portions 78 that extend continuously from the traces on the first edge surfaces and along the flange surfaces 103A and 105B away from the spacer elements 89A and 89B in the directions $H_1$ and $H_2$, respectively. As used in this disclosure, a statement that a trace extends "along" a surface means that the trace extends in proximity to the surface and substantially parallel to the surface.

The structure 90 further includes traces 36b extending from some of top terminals 38 along top surface 98, the second edge surfaces 101A and 101B, and along respective portions of the flange surfaces 105A and 103B extending away from the spacer elements 89A and 89B in the directions $H_2$ and $H_1$, respectively. These features are identical to the features of the first edge surfaces 100 and traces 36a discussed above. Traces 36b connect some of the top terminals 38 to some of the bottom terminals 64 and to the passive element 48 through some of the traces 62 on the substrate.

The spacer elements 89A and 89B may define a microelectronic element receiving region 110 of predetermined size and predetermined shape to accommodate a microelectronic element, such as a semiconductor chip alone, a microelectronic assembly or a microelectronic package containing at least one chip, disposed laterally from the spacer elements 89A and 89B and connected to the substrate 56 at a portion of the upper surface 58 that a bottom portion 112 of the region 110 overlies. For example, referring to FIG. 7A, the bottom portion 112 may have a linear dimension R1 extending in the horizontal direction $H_1$ from the bottom border 104 of the spacer element 89A to the bottom border 104 of the spacer element 89B, and a linear dimension R2 extending in a horizontal direction orthogonal to the direction $H_1$ between opposing ends 105 of the spacer elements 89 extending in a direction parallel to the horizontal direction $H_1$. The region 110 includes a space that extends, at the bottom portion 112, upwardly from exposed portions of the upper surface 58, exposed portions of the flange surfaces 103A and 105B and the bottom portions 78 of traces on the flange surfaces 103A and 105, to a predetermined vertical distance from the upper surface 58 of the substrate, which may be a height this above, the same or below height of the top surface 98 of one or both of the spacer elements as measured vertically from the upper surface 58. The region 110, thus, includes a space defined between the spacer elements 89A, 89B having the traces 36 on the surfaces 100A and 100B. The region 110 is of a predetermined size and shape that is based on size, shape and positioning of the spacer elements on the upper surface of the substrate, and provides that a portion of a microelectronic element by itself, or within a package or assembly, to be connected to a portion of the substrate that the portion 112 overlies can be disposed in the region 110 without the element, package or assembly contacting the traces on the surfaces 100A and 100B.

In one embodiment, the traces 36 may be embedded in the top surface 98 and the edge surfaces 100 and 101, with the surfaces of the traces lying substantially flush with the surfaces of the dielectric mass or overmold forming the spacer element, as described in U.S. Ser. No. 13/295,608 filed Nov. 14, 2011, incorporated by reference herein. The traces and terminals may be formed from a solid metal as, for example, a solid copper or copper alloy. Typically, a solid metal provides higher conductivity than a composite including metal and a binder.

In this arrangement, some of the top terminals 38 may be connected to the leads 49 of the passive element 48 by way of the conductive elements on the substrate, and some or all of the top terminals 38 may also connected to some or all of the bottom terminals 64.

In one embodiment, a solder mask 111 may be selectively applied over the traces 36 extending on the overmold or dielectric mass, such that the traces are at least partially uncovered. Similarly, a solder mask can be provided as needed on the conductive features of the substrate. Such solder mask can be applied and patterned in any conventional manner. The solder mask serves to limit the spread of solder along the surfaces of the traces.

In some embodiments, the conductive features of the structure 90 may be disposed on the top surface of the substrate, or even within the substrate. Moreover, the substrate may include more than one layer of traces.

In another embodiment, a carrier used to hold the traces and terminals may be an element other than a sheet. For example, the traces and terminals can be deposited onto a mold element which is then used to form the top surface and edge surfaces of a dielectric mass. When the mold is removed, the top terminals and traces remain embedded in the dielectric mass, in much the same way as discussed with reference to FIGS. 3-5 above.

In other embodiments, the traces on the carrier sheet are not connected to the conductive features of the substrate prior to introduction of the dielectric composition to form the dielectric mass. For example, the traces 36 formed with bottom portions 78 extending along the flange surfaces may not be connected to the conductive features, such as traces 62 on the substrate 56 before a molding operation. In such embodiment, either before or after removal of the carrier or sheet (not shown), referring to FIG. 8, vias 123 may be formed through the flange portion of the dielectric mass, i.e., the portion disposed beneath the flange surfaces, and conductors 109 are disposed within these vias and connect the bottom portions 78 of the traces to the conductive elements of the substrate 56. See U.S. Ser. No. 13/295,608 filed Nov. 14, 2011, incorporated by reference herein. In one embodiment, vias may be formed by processes such as laser ablation, etching, sandblasting or the like before or after forming the masses on the substrate. In a further alternative, vias may be formed in part by features of a mold used to form a dielectric mass, as discussed below, and in part by post-mold processing.

Figure 9A:
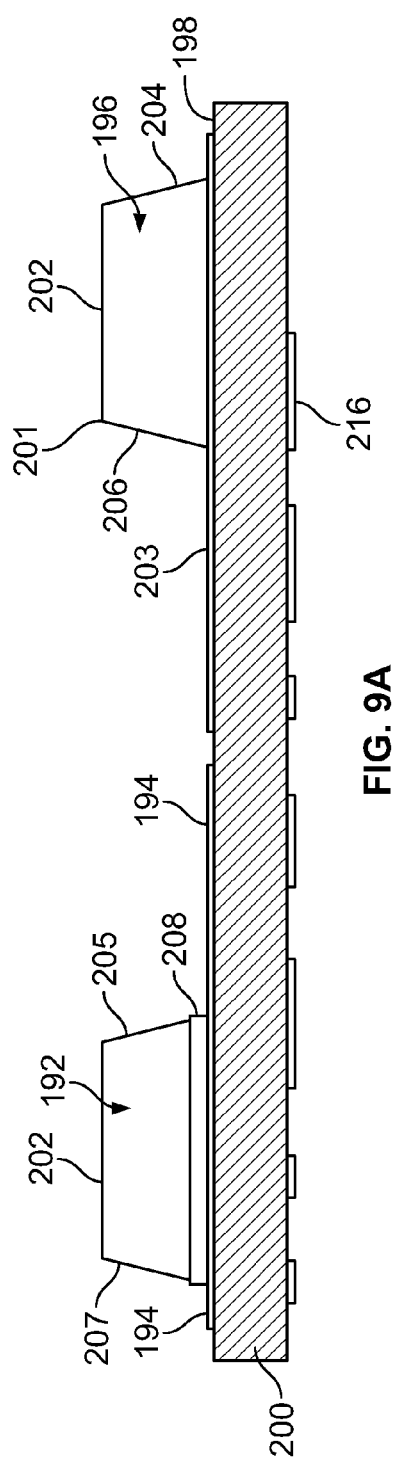
FIGS. 9A and 9B are stages of an exemplary process for manufacturing another embodiment of a structure, in accordance with the disclosure.

A process according to a further embodiment of the invention for manufacture of a structure 190 (FIGS. 9A-9B), which is similar in construction to the structure 90, may use a preformed dielectric mass 192, such as a substrate consisting essentially of dielectric material, and use a mold element (not shown) to form a dielectric mass 196. In this process, the carrier is not present at the time of molding to form the dielectric mass 196 on substrate 200, which has a similar construction to the substrate 56 described above, and conductive elements including traces 194 on upper surface 198 of substrate 200 may be present at the time of molding. Referring to FIG. 9A, the dielectric mass 196 may be formed on the upper surface 198 and have a configuration similar to the dielectric masses 87 discussed above and also may include flange portions defining flange surfaces (not shown) as discussed above. The mass 196 has a top surface 202 and edge surfaces 204 and 206 extending to the upper surface 198 of the substrate, similarly as the edge surfaces 100 and 101 described above, where the edge surface 206 extends from a top border 201 at the top surface 202 to a bottom border 203 adjacent the upper surface 198. In one embodiment, the dielectric mass 196 may be molded over a passive element (not shown), which is connected by leads to traces 216 on a bottom surface 199 of the substrate 200, similarly as described above for the passive element 48.

In addition, the pre-formed dielectric mass 192 having edge surfaces 205 and 207, similar to the edge surfaces 100 and 101, respectively, of the spacer elements 89, may be attached to a portion of the upper surface 198 of the substrate 200, laterally spaced from the dielectric mass 196, similarly as the spacer element 89A is arranged laterally spaced to the spacer element 89B in the structure 90, using an adhesive 208, such as curable adhesive or epoxy.

Figure 9B:
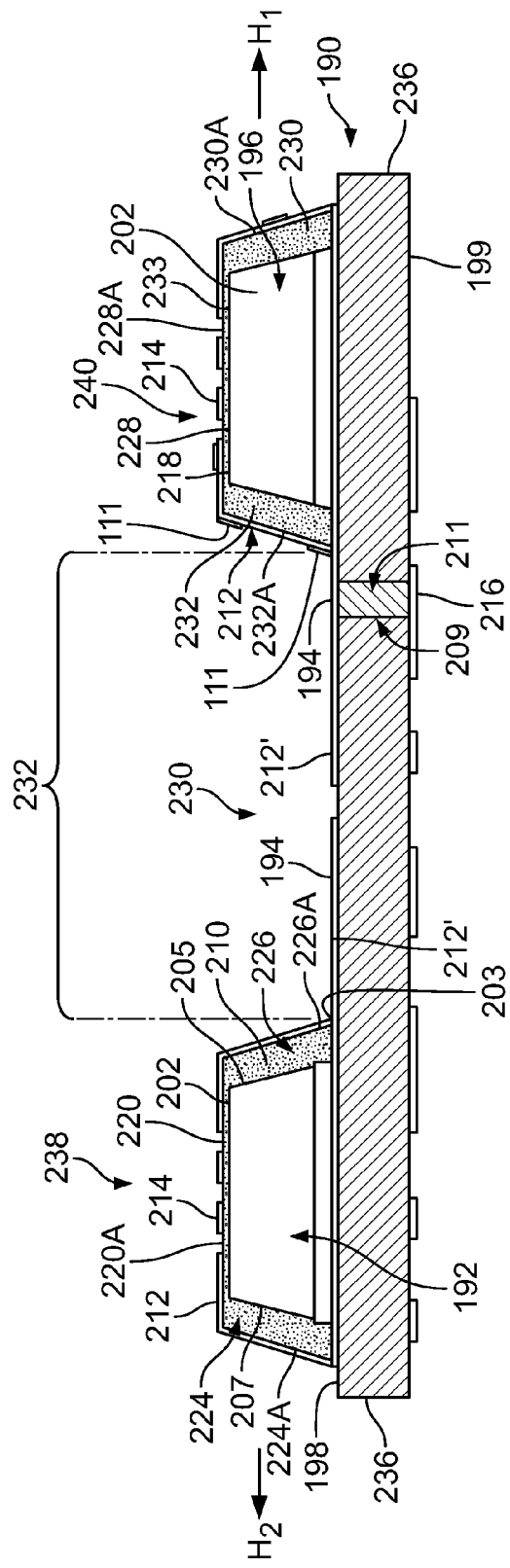

Referring to FIG. 9B, in one embodiment to obtain the structure 190, a dielectric sheet 210 carrying traces 212 and top terminals 214 may be positioned over the assemblage including the substrate 200 and the dielectric masses 192 and 196, and then deformed over the top surfaces 202 of the dielectric masses 192 and 196 and the edge surfaces 204, 205, 206 and 207 and flange surfaces (not shown) of the dielectric mass 202. Here again, bottom portions of the traces are disposed adjacent the substrate 200, so that via conductors in via (not shown) may be readily formed through the relatively thin flange portions of the dielectric mass 196, similarly as described above.

In addition, via conductors 211 may be disposed in vias 209 in the substrate 200 and electrically connect bottoms portions 212' of the traces 212 on the sheet overlying flange portions of the masses (not shown in FIG. 9B), or traces 194 on the upper surface 198, to conductive elements 216 on a bottom surface 199 of the substrate 200. In the particular embodiment depicted in FIG. 9B, the sheet 210 is bonded to the dielectric masses by a thin layer of an adhesive 218. For this purpose, the sheet 210 may incorporate an adhesive at surface 233, which faces toward the substrate during the molding process. Thus, the dielectric sheet 210 forms a layer closely overlying the dielectric masses 192 and 196 and adhering thereto in a final product.

A first portion 220 of the dielectric sheet 210 and corresponding first portions of traces 212 extend over the top surface 202 of the dielectric mass 192, a second portion 224 of the sheet 210 and those portions of the traces 212 lying on the second portion 224 extend from the first portion 220 toward the substrate 200, and a third portion 226 of the sheet 210 and those portions of the traces 212 lying on the third portion 226 extend from the first portion 220 toward the substrate 200. The traces 212 may include bottom portions that extend from the third portion 226 at the bottom border 203 of the dielectric mass 192 in the horizontal direction $H_1$ along the upper surface of the substrate 200. The portions 220, 222 and 224 define a top surface 220A, an edge surface 222A and an edge surface 224A, respectively, of a spacer element 238 including the portions 220, 222 and 224 and the dielectric mass 192.

In addition, a fourth portion 228 of the dielectric sheet 210 and corresponding first portions of traces 212 extend over the top surface 202 of the dielectric mass 196, a fifth portion 230 of the sheet 210 and those portions of the traces 212 lying on the fifth portion 230 extend from the fourth portion 228 toward the substrate 200, and a sixth portion 232 of the sheet 210 and those portions of the traces 212 lying on the sixth portion 232 extend from the fourth portion 228 toward the substrate 200. The portions 228, 230 and 232 define a top surface 228A, an edge surface 230A and an edge surface 232A, respectively, of a spacer element 240 including the portions 228, 230 and 232 and the dielectric mass 196. In one embodiment, a solder mask 111 may be selectively applied over portions of the traces 212 lying on the portions 228, 230 and 232, such that portions of the traces 212 lying on the portions 228, 230 and 232 are at least partially covered by the solder mask.

In a further step of manufacture of the structure 190 where the substrate may or may not include traces on the upper surface thereof formed before the dielectric sheet 210 with the traces 212 is joined with the substrate 200, traces 194 may be patterned onto the upper surface 198 to electrically connect at the bottom borders 203 of the spacer elements 238 and 240 with the traces 212 extending along the edge surfaces 226A, 224A, 230A and 232A. For example, the entire upper surface of the substrate can be plated, masked and selectively etched to form the traces. Alternatively, the upper surface may be covered with a mask material, and then selectively exposed to laser radiation to cut grooves through the mask. A seed layer can be applied over the mask and into the grooves, whereupon the mask is removed so as to lift off the seed layer everywhere except at the grooves. The surface is then exposed to a plating bath, so that metal is deposited only at the grooves where the seed is present. Any other technique for forming metallic features on a dielectric body can be used.

In one embodiment, the dielectric masses 192 and 196 do not include flange surfaces, such as described for the structure 90. Thus, edge surfaces 204, 205, 206 and 207 extend all the way to the upper surface 198 of the substrate 200. The traces 212 extend downwardly along the edge surfaces so that the bottom portion of each trace terminates at the bottom of the edge surface, where the traces join the conductive elements 194 on the upper surface of the substrate 200.

Similarly as discussed above for the structure 90, edges 236 of the substrate 200 may be defined after the spacer elements 238 and 240 have been formed on the substrate 200, when the substrate 200 is severed from a larger sheet or tape. The completed structure 190, as depicted in FIG. 9B, incorporates portions of the sheet 210 as part of the structure.

In other embodiments, flowable dielectric material used to form the dielectric mass 196 may serve as an adhesive which bonds the formed dielectric mass 196 to the sheet 210. Merely by way of example, the sheet may include materials commonly used in flexible printed circuits as, for example, polyimides and BT resin. Also, a solder mask (not shown) may be applied over the traces on the sheet prior to deforming the sheet, provided that the solder mask can withstand the temperatures and pressures used during the molding process.

The dielectric sheet 210 formed over the dielectric elements 192 and 196 in the structure 190 is advantageous for the following reasons. The sheet 210 may provide that a difference between a slope of the surface 220A and a slope of each of the surfaces 222A and 224A is SD1, and a difference between a slope of the surface 228A and a slope of each of the surfaces 230A and 232A is SD2, where SD1 and SD2 are less than SD3, which is a difference between a slope of the top surface 202 and a slope of each of the edge surfaces of the dielectric masses 192 and 196. The smaller difference in the slopes for the structure 190 including the sheet 210 provides that traces extending along the top surface have a more gradual transition at the point the traces extend vertically downwardly to extend along the downwardly extending edge surfaces of the spacer element including the dielectric sheet, than the transition of the traces at the point the traces extending vertically downwardly from the top surface of the spacer element to the edge surface if the dielectric sheet is omitted and the dielectric masses alone serve as the spacer elements. In some embodiments, a first surface 220A and a second surface 222A or 224A adjacent to the first surface 220A, over which the traces extend, may have some radius of curvature, instead of a sharp angle, at a transition from the first surface to the second surface. For example, dielectric masses formed by molding may have a more acute transition from the top surface to the edge surfaces of the mold than that of a dielectric sheet applied over the molded dielectric mass. Therefore, for the structure 190 formed using the sheet 210, the traces extending from the top surface to the edge surfaces may follow a more gradual or arcuate path than traces extending from the surface 202 to the edge surfaces on the dielectric masses 192 and 196 may follow. Consequently, stress on the traces may be reduced at a point where a direction that the traces extend changes in a vertical direction, in particular at a point that the traces transition from extending over one substantially planar surface, such as surface 202, to over edge surface 205, which is also a planar surface extending transverse to the surface 202, such that damage or failure of the trace may be avoided.

Referring to FIG. 9B and also FIG. 6, the structure 190, like the structure 90, defines a microelectronic element receiving region 231 of predetermined size and shape so as to accommodate a microelectronic element, assembly or package disposed spaced laterally from the spacer elements 238 and 240 and connected to the substrate 200 at a portion of the upper surface 198 that a bottom portion 232 of the region 230 overlies. The region 230 extends, at the bottom portion 232, upwardly from exposed portions of the upper surface 198, exposed portions of flange surfaces of the dielectric mass 196, the bottom portions of traces 212 on the flange surfaces of the dielectric mass 196, and any traces 194 extending along the upper surface 198, to a predetermined vertical distance from the upper surface 198 of the substrate. As such, the region 231 includes a space defined between the spacer elements 238, 240 with the traces 212 on edge surfaces of the portions 226A and 232A. Like the region 110, the region 231 is of a predetermined size and shape that is based on the positioning, size and shape of the spacer elements on the upper surface of the substrate, such that a portion of a microelectronic element, package or assembly to be connected to the substrate below the portion 232 can be disposed in the region 230 without contacting the traces on the surfaces 226A and 232A.

In an alternative embodiment, referring again to FIG. 9A, after the molding of the dielectric mass 196 on and attachment of the dielectric mass 192 to the substrate 200 are completed, a carrier sheet carrying traces and top terminals may be applied over the top surfaces of the dielectric masses 192 and 196, similarly as described above for fabrication of the structure 90, to form a structure with traces extending from the top surfaces and downwardly along edge surfaces of spacer elements that constitute the masses 192 and 196 and over the upper surface of the substrate on flange surfaces.

Figure 10A:
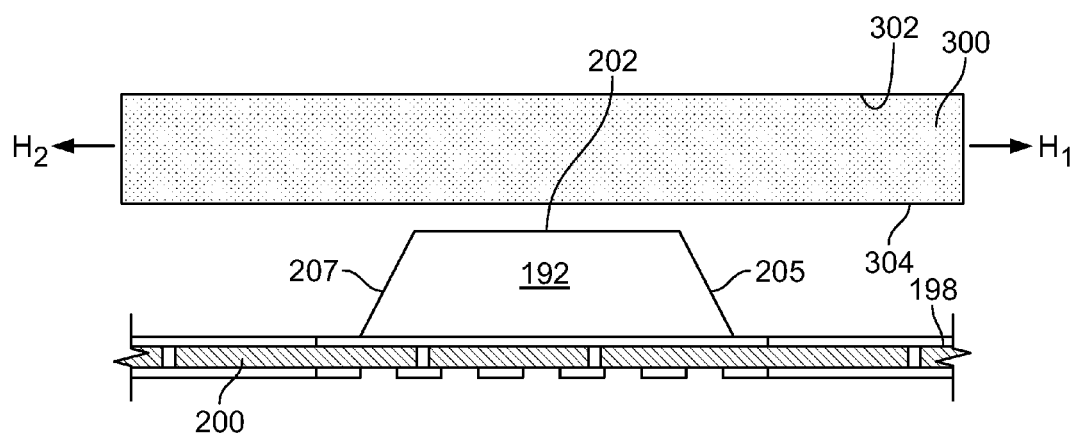
FIGS. 10A and 10B are fragmentary sectional views depicting stages in an exemplary process for manufacturing another embodiment of a structure, in accordance with the disclosure.
Figure 10B:
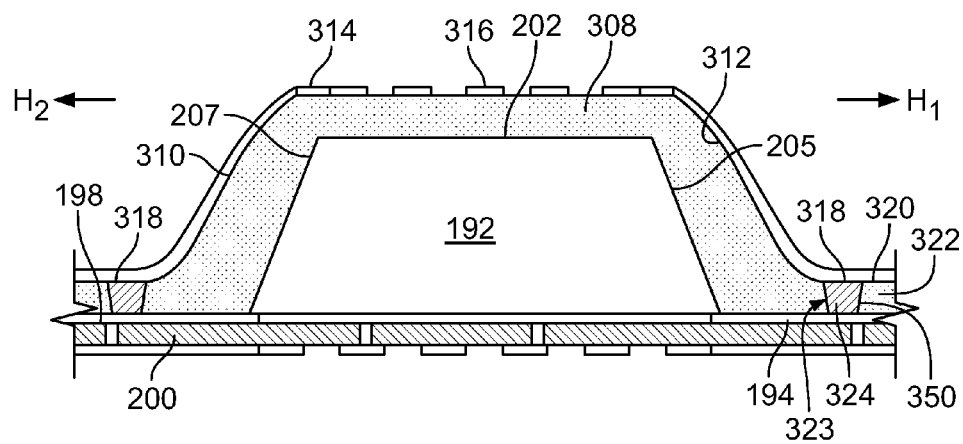

In another embodiment, a dielectric layer may be formed over dielectric masses 192 and 196, such as shown in FIG. 9A, by use of a conformal dielectric layer which is applied selectively over the masses, to obtain a structure with laterally spaced spacer elements defining a microelectronic element receiving region therebetween. For example, referring to FIGS. 10A-10B which illustrate a portion of the structure of FIG. 9A following formation of the masses 192 and 196 on the substrate, a dielectric layer 300 having an upper surface 302 and lower surface 304 may be applied to an assemblage including the masses 192 and 196 and the substrate 200. FIGS. 10A-10B illustrate application of the layer 300 over the mass 192 only, and it is to be understood that similar features will be obtained at the mass 196 as those obtained at the mass 192 as described below. When the conformal layer 300 is applied, the layer 300 sags into contact with the upper surface 202 and the edge surfaces 205 and 207 of the mass 192 and with exposed portions of the upper surface of the substrate extending in the horizontal directions $H_1$ and $H_2$ away from the mass 192. Thus, at the time the conformal layer is applied to the assemblage, the conformal layer should have sufficient softness and deformability to conform in this manner. Merely by way of example, the conformal layer may be a "B-stage" or partially cured epoxy composition, which may optionally contain a particulate filler material. After application, the conformal layer may be hardened as, for example, by chemical reaction. As the conformal layer deforms to cover the exposed surfaces of the assemblage, a first portion of the conformal layer defines a top surface 308, remote from the substrate 200 and extending over the mass 192, and additional portions of the conformal layer define edge surfaces 310 and 312 extending downwardly toward the substrate in an area of the substrate outside of the area covered by the mass 192.

After the conformal layer is applied and cured, traces 314 and top terminals 316 are formed on the cured layer, for example, similarly as described above for formation of traces on the substrate 200. The top terminals 316 are at the top surface 308 and traces 314 extend from at least some of the top terminals 316 along the top surface 308 and also extend downwardly toward the surface 198 along edge surfaces 310 and 312 of the cured layer 300. In the particular embodiment of FIGS. 10A-10B, the conformal layer forms flange portions 322 defining the flange surfaces 320, and the bottom portions 318 of the traces extend along the flange surfaces 320. The bottom portions are connected to the conductive elements of the substrate by forming vias 323 through the flange portions and depositing via conductors 324 in these vias 323.

In another embodiment, referring again to FIG. 10B, the bottom portions 318 of traces 312 may be bonded to the upper surface conductive elements 194 of the substrate by bonds 350 disposed within vias 323. Merely by way of example, such bonds may be formed by soldering, eutectic bonding thermosonic bonding or the like. The bonding materials may be carried on the traces 312 or deposited into the vias.

The process of applying a conformal layer, like the other processes discussed above, can be conducted using assemblages which are formed as a large sheet of many assemblages having a common substrate, using a continuous or semi-continuous conformal layer having traces and terminals for numerous structures. The assemblages are severed from one another after application of the conformal layer to obtain the individual structures.

In a variant of the process discussed above with reference to FIGS. 10A and 10B, the conformal layer is applied to the assemblages with traces 314 and top terminals 316 already in place on the conformal layer. For example, the conformal layer itself may include plural sub-layers such as a flexible top layer bearing the top contacts and terminals and a conformal bottom layer such as a B-stage epoxy.

Figure 7B:
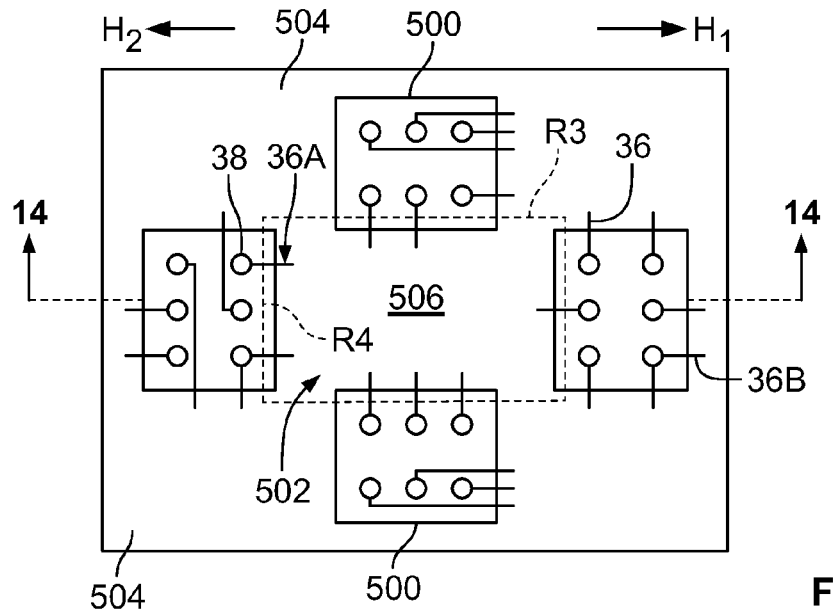
FIG. 7B is a diagrammatic plan view depicting an exemplary structure in the package assembly of FIG. 14, in accordance with the disclosure.
Figure 7C:
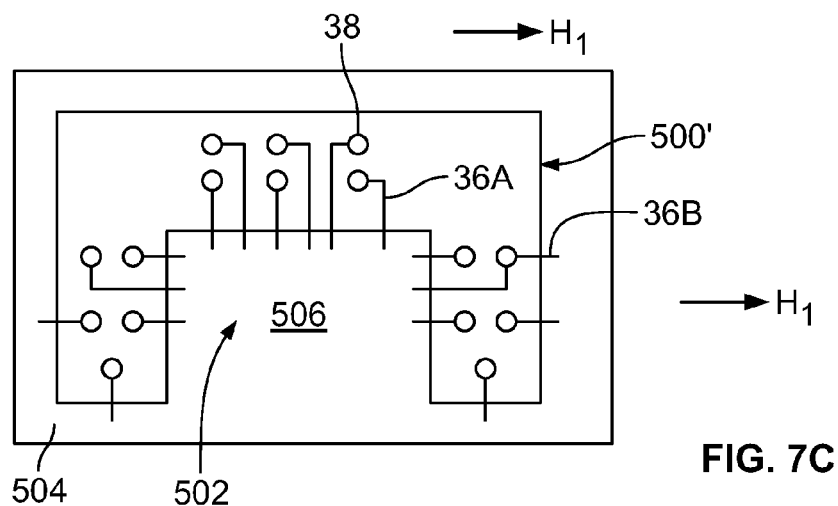
FIGS. 7C and 7D are diagrammatic top plan views depicting exemplary structures, in accordance with the disclosure.

Referring to FIGS. 7B and 7C, alternative arrangements of spacer elements on a substrate may be used to obtain a microelectronic element receiving region, in accordance with embodiments of the disclosure. For example, one or more spacer elements 500 may be formed on an upper surface 504 of a substrate, such as similar to the substrate 56, to have a size, shape and arrangement on the upper surface, such as relative to one another, to define a microelectronic element receiving region 502 of size and shape that may accommodate a microelectronic element, package or assembly, similarly as described above for the region 110. Referring to FIG. 7B, four spacer elements 500 may be arranged to define the region 502 overlying the upper surface 504 of the substrate and having a bottom portion 506 having horizontally extending dimensions R3 and R4. Referring to FIG. 7C, the spacer element 500 may be a single element that defines a region 502 having a rectangularly-shaped bottom portion 506, three sides of which are defined by the single element.

Figure 7D:
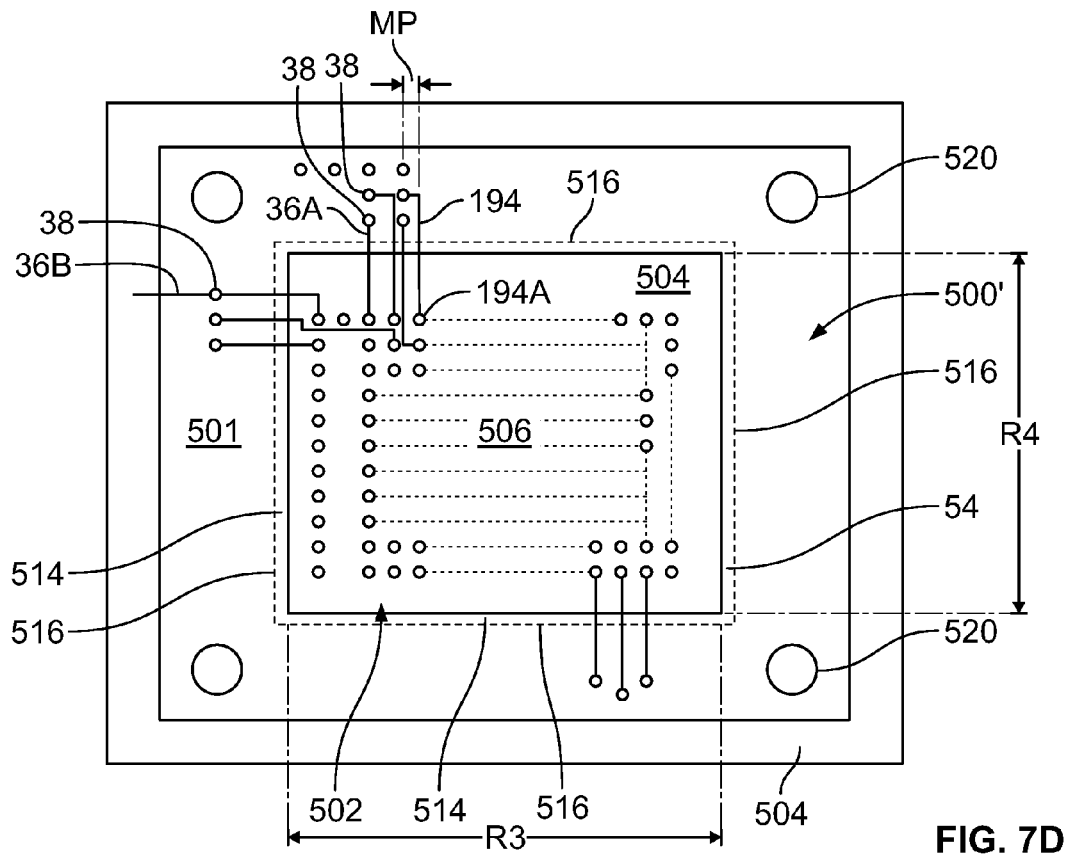

Referring to FIG. 7D, a single spacer element 500' may be attached to the upper surface 504 of the substrate and completely define the bottom portion 506 of the region 502, where the bottom portion 506 has horizontally extending dimensions R3 and R4. In such embodiment, the spacer element 500' includes edge surfaces 514 extending from a surface 501 of the spacer element 500' at a top border 516 of the spacer element 500' downwardly toward the surface 504, where the surface 501 overlies the upper surface 504 of the substrate in the same manner as the surface 202 overlies the upper surface of the substrate as shown in FIG. 9A. The traces 36A may extend from the terminals 38 at the surface 501, downwardly along the inclined edge surfaces 514 toward the portion of the surface 504 that the bottom portion 506 overlies, and be electrically connected to traces 194 on the surface 504 that extend along the surface 504 and are electrically connected to pads 194A at the surface 504. Adjacent terminals 38 may have a minimum pitch MP. In some embodiment, the spacer element 501' may include terminals 520 on the surface 501 configured for electrical connection to a predetermined potential, such as a ground potential.

Figure 11:
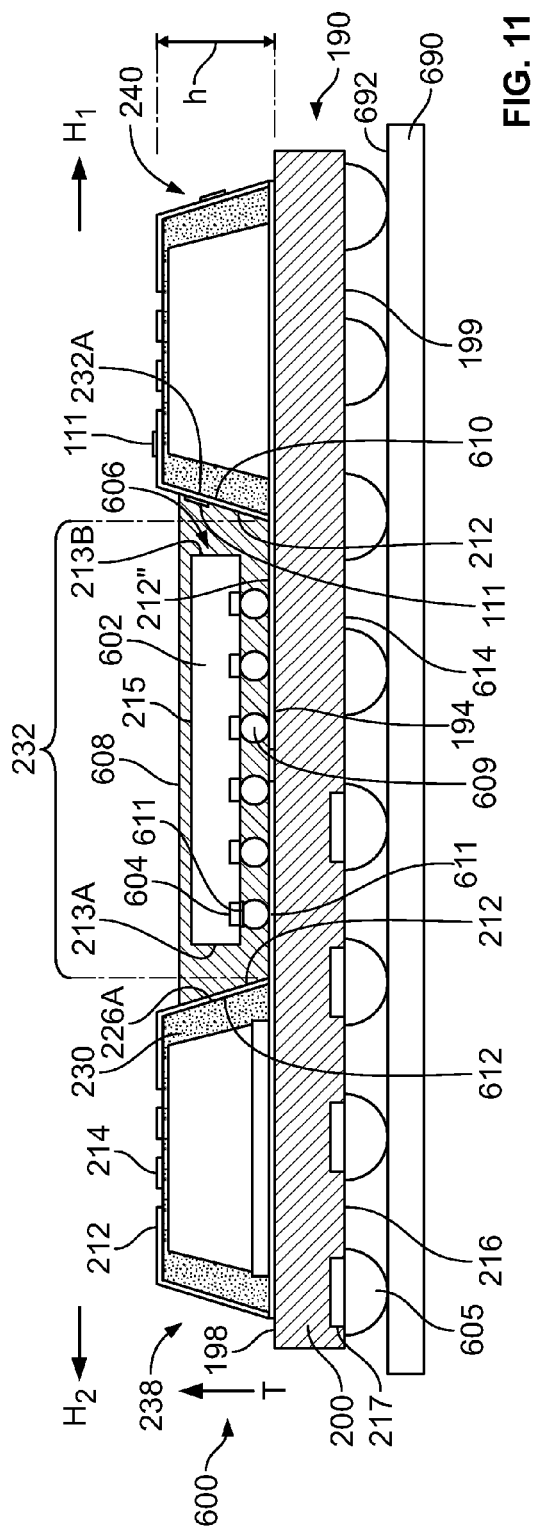
FIG. 11 is a diagrammatic sectional view of an exemplary package assembly including the structure of FIG. 6, in accordance with the disclosure.

Referring to FIG. 11, a package assembly 600 may include the structure of the present disclosure connected to a microelectronic element, package or assembly at the microelectronic element region of the structure. The package assembly 600, for example, may include the structure 190 as described above, connected to a microelectronic element 602. The microelectronic element or chip 602 is positioned in a "face-down" orientation relative to the substrate 200 in the region 230. Contacts 604 of the microelectronic element 602 are bonded by solder elements 609 to the upper surface conductive elements 194 or the bottom portions 212' of the traces 212, and the bottom portion 232 of the region 230 overlies the conductive elements 194 or the bottom portions 212' bonded to the solder elements 609. The contacts 604 may be electrically connected to pads 217 extending from traces 216 on the bottom surface 199 of the substrate 200, and the terminals 214 and traces 212 on the spacer elements 238 and 240, through electrical circuitry within or conductive vias extending through (not shown) the substrate 200. The assembly 600 may be joined to an external component 690, such as a printed circuit board, by electrically connecting solder elements 605, such as solder balls, formed at the pads 217 to contacts (not shown) on a facing surface 692 of board 690 arranged in a pattern corresponding to that of the pads 217 of the structure 190.

In one embodiment, the region 230 may be adapted such that, when the microelectronic element 602 is bonded to the substrate 200, opposing edge surfaces 213A and 213B of the microelectronic element 602 that face the edge surfaces 226A and 232A, respectively, are spaced a distance of at least about 200 microns from the edge surfaces 226A, 232A. In some embodiment, the distance of the spacing may permit that dielectric material, for example, underfill, may be provided between the facing surfaces 213A and 226 and the facing surfaces 213B and 232A. In another embodiment, the distance of the spacing may permit molding of dielectric material over a top surface 215 of the microelectronic element 602, which extends between the surfaces 213A and 213B, and the surfaces 213A and 213B.

A dielectric mass or overmold 606 is formed over the bottom portion 232 of the region, such as using any of the techniques described to form the dielectric masses over the substrate 56 or 200 discussed above. The dielectric mass 606 has a top surface 608 remote from the upper surface 198 that extends over the microelectronic element 602 and away from the element 602 over the upper surface 198 in the horizontal directions $H_1$ and $H_2$ toward the edge surfaces 226A and 232A of the spacer elements 238 and 240, respectively. In one embodiment, the top surface 608 extends to the edge surfaces 232A and 226A, and includes edges surfaces 610 and 612 extending downwardly therefrom to the substrate 200 facing, and in some embodiments along, exposed portions of the edge surfaces 232A and 226A and the traces 212 extending along the edge surfaces 232A and 226A, respectively. As such, the traces 212 may extend between the edge surfaces 610 and 612 of the dielectric mass 606, which may be made from a first dielectric material, and the exposed edge surfaces 232A and 226A of the spacer elements, which may be made from a second dielectric material of the portions 226 and 232 that is different from the first dielectric material. In one embodiment, solder mask 111 may at least partially cover portions of the traces 212 extending between the edge surface 232A and the edge surface 610. In an alternative embodiment where the spacer elements 238 and 240 include only the dielectric material of the masses 192 and 196, the traces 212 may extend between the edge surfaces 610 and 612 and the exposed edge surfaces 205 and 206. The dielectric mass 606 further includes a bottom surface 614 extending from the edges surfaces 610 and 612 in horizontal directions $H_1$ and $H_2$ away from the spacer elements 238 and 240 and along exposed portions of the upper surface 198 and traces 194 on the upper surface 198, and optionally along flange surfaces of flange portions that from the spacer elements.

In one embodiment, a thickness (h) of the spacer element 238 or 240, in a thickness direction T of the assembly 600 orthogonal to $H_1$ and $H_2$, extends upwardly away from the surface 198, and is the same as, greater than, or less than a thickness of the microelectronic element 602 in the direction T. In another embodiment, the thickness (h) of at least one spacer element is less than or equal to the thickness in the direction T of the dielectric mass 606 with the microelectronic element 602 encapsulated therein.

In some embodiments, referring to FIG. 11, the solder elements 609 may include flat surfaces 611 facing the conductive traces at the upper surface 198 and the traces 604.

Figure 12:
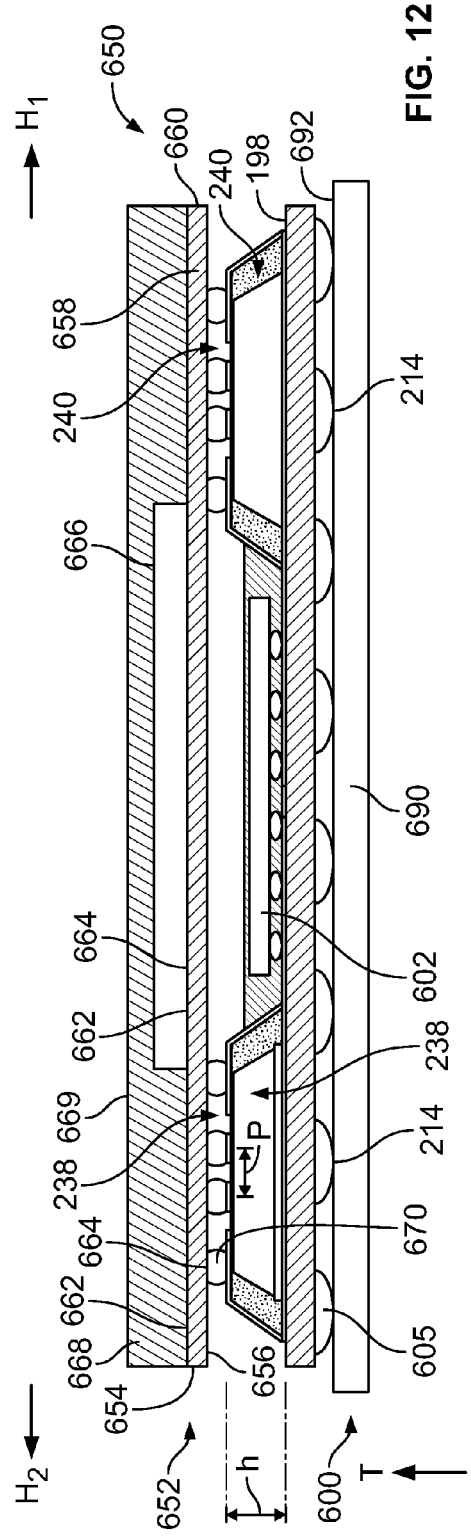
FIG. 12 is a diagrammatic sectional view of an exemplary package assembly including the package assembly of FIG. 10 and another package assembly, in accordance with the disclosure.

In another embodiment, referring to FIG. 12, a package assembly 650 may include the package assembly 600 as shown in FIG. 11 joined to a microelectronic package 652. The package 652 may include a substrate 654 having a first surface 656 and second surface 658 remote from the first surface 656, and edges 660 extending between the surfaces 656 and 658. The surfaces 656 and 658 extend in the horizontal directions $H_1$ and $H_2$, and conductive elements including traces 662 and pads 664 that extend from the traces 662 extend along the surfaces 656 and 658. A microelectronic element or chip 666 is positioned in a "face-down" orientation facing the surface 658, and contacts (not shown) of the microelectronic element 666 are electrically connected to the pads 664 by any suitable connection, for example, by small diameters bonds, such as solder elements (not shown), which allow close spacing of the contacts of the element 666 and the pads 66. A dielectric mass or overmold 668 is formed over the microelectronic element 662 and the surface 658 of the substrate 660 to encapsulate the element 662, such as using any of the techniques described to form a dielectric mass, where a surface 669 of the mass 668 overlies the surface 658 and the microelectronic element 666. The pads 664 are arranged in a pattern on the surface 656 of the substrate 654 corresponding to respective terminals 214 of the structure 190. As such the pads 664 and the corresponding terminals 214 may be in alignment, in a thickness direction T of the assembly 650, when the substrate 654 is positioned over the assembly 600 with the terminals 214 facing the pads 664. Solder elements 670, such as solder balls, may be formed, for electrically connecting corresponding ones of the terminals 214 and the pads 664 to each other.

In accordance with the present disclosure, the solder elements 670 may be arranged in an array having a predetermined minimum pitch (P) that is very fine, such as about 150-400 microns, and a thickness (h) of the spacer elements 238 and 240 in the thickness direction T, from the top surfaces 220A and 228A to the upper surface 198 of the substrate 200, may be greater than one-half of the minimum pitch (P), where (h) is greater than 50 microns and may be up to 500 microns. Consequently, the microelectronic package 652 may be joined to the package assembly 650 in a stacked configuration, where the solder elements arranged having a very fine pitch electrically connect the contacts of the package 652 to the terminals of the package assembly facing such contacts, which terminals may have a minimum pitch MP such as shown in FIG. 7D, such that a very large number of electrical interconnections may be obtained between the package assembly 650 and the package 652, such as over 1000. The spacer elements 238 and 240, which have a relatively large thickness (h) in the direction T, arrange the terminals of the assembly 600 to be closer to the corresponding terminals of the package 652 to which electrical interconnections are desired. The solder elements 670, which provide for the electrical interconnection between the package 652 and assembly 650, may thus extend a shorter length in the direction T, to achieve the desired electrical connection, thereby permitting for smaller sized solder elements and hence a finer pitch of the solder element array. Advantageously, the finer solder array pitch may be achieved without adversely impacting conductive element routing on the package assembly 600 to which the microelectronic package 652 is electrically connected. In some embodiments, the height (h) of the spacer elements may be less than the thickness of the microelectronic package 650, because the solder elements themselves extend some length in the thickness direction T of the assembly, thereby permitting that the thickness (h) of a spacer element may be as small as one-half the pitch (P) of the array of solder elements. In one embodiment, the microelectronic element 662 may be a memory chip electrically connected to the microelectronic element 602, which may be a logic element, through the terminals 214, 264, traces 214 and 662 and electrical circuitry of the substrates 654 and 200.

It is to be understood that a plurality of packages similar to the package 652 as shown in FIG. 12 may be stacked one atop the other, with the pads 664 of the next higher package aligned with contacts formed on the facing surface 669 of the lower package in the stack, and conductors extending in vias (not shown) in the dielectric mass 668 of the lower package electrically connect conductive elements of the higher package to conductive elements of the lower package.

In another embodiment, referring to FIG. 13, a package assembly 700 may include an assembly 600' joined with a microelectronic package 701. The assembly 600' includes the structure 190 as described above, and a microelectronic element 702 with its contacts (not shown) facing the surface 199 and electrically connected to pads 217 on the surface 199. A dielectric mass 704 is formed over the microelectronic element 702 and the surface 199, and has a surface 706 overlying the element 702 and the surface 199. The mass 704 covers the microelectronic element 702 and the surface 199, similarly as described above for the dielectric mass 668 formed over the element 666 and the surface 199 as in FIG. 12. The package 701 includes a substrate 706 having a first surface 708 remote from a second surface 710, and conductive elements 712 extending along the surfaces 708 and 710. In addition, a microelectronic element 714 is positioned in a "face-down" orientation facing the surface 708, and contacts (not shown) of the microelectronic element 714 are bonded to the conductive elements 712 on the surface 708 by solder elements 717. A dielectric mass 718 is formed over the microelectronic element 714 and a portion of the surface 708 of the substrate 706 to encapsulate the element 702 and form an encapsulated microelectronic element 719, such as using any of the techniques described to form a dielectric mass. A surface 720 of the mass 718, remote from the substrate 706, overlies the microelectronic element 714 and portions of the surface 708 adjacent the element 718. The encapsulated element 719 including the dielectric mass 704 and microelectronic element 714 has a predetermined size and configuration and is arranged at a predetermined position over the surface 708, and terminals 214 of the assembly 600' are arranged in a predetermined array on the surfaces 220A and 228A of the spacer elements, such that the assembly 600' may be positioned over the package 701 with the terminals 214 aligned in the thickness direction (T) of the assembly 700 with corresponding ones of the pads 712 and with the encapsulated element 719 extending into the receiving region 230 of the assembly 600' without contacting the assembly 600'. In one embodiment, the surface 720 of the mass 718 may contact the surface 198 of the substrate 200, but no other surface of the assembly 600' is in contact with the assembly 701. As such, solder elements 720 may electrically connect the terminals 214 with corresponding pads 712, so as to electrically connect the elements 702 and 714 with each other. As in the embodiments discussed above, the spacer elements 238 and 240 have a height (h) in the thickness direction T of the assembly 700 that permits the array of the solder elements 720 to have a predetermined minimum pitch (p) such that a large number of electrical interconnections of the assembly 600' to the package 701 may be formed at the terminals, where h is greater than one-half the minimum pitch (p).

Similarly, as discussed above in connection with FIG. 12, a plurality of packages 600' similar to the package 600' as shown in FIG. 13 may be stacked one atop the other, where the microelectronic element of each package 600' is a memory chip and the microelectronic element 718 is a logic chip. The terminals 214 of a higher package 600' in the stack are aligned with contacts formed on the facing surface 706 of the adjacent lower package 600', and conductors extending in vias (not shown) in the dielectric mass 704 of the lower package 600' electrically connect the terminals of the higher package 600' to conductive elements of the lower package(s) 600'.

In another embodiment, referring to FIG. 14, a package assembly 750 may include the assembly 600' joined with a microelectronic component 752 such as a microelectronic package. The package 752 has a similar construction to the package 701, except that the package 752 extends not more than predetermined length in the horizontal directions $H_1$ and $H_2$ and has a thickness in the direction T of not more than a predetermined thickness H2. H2 is a distance in the thickness direction (T) from the surface 656 to a facing surface of the external component 690 to which both the package assembly 600' and the package 752 are electrically interconnected, less an expected thickness of a solder element that electrically interconnects the package 752 to the component at facing surfaces 692 and 710. For example, referring also to FIG. 7B, which is a plan view of the embodiment of the assembly 600' forming the package 750 of FIG. 14, the package 752, at the surface 720, may extend over a horizontal area having maximum dimensions of R3 and R4, have a predetermined shape in the thickness direction T and have a thickness extending from the surface 720 to the surface 708 at most equal to H2, such that the terminals 712 at the surface 710 and the terminals 214 of the package 600' may be aligned in the thickness direction of the assembly 750 with pads (not shown) on the surface 692 of the external component 690 and the package 752 is within the region 502 without contacting the assembly 600'. Solder elements 786 electrically interconnect the terminals 214 with corresponding contacts of the component 690, and solder elements 788 electrically interconnect conductive elements 712 with corresponding contacts of the component 690. Similarly as in the above embodiments, in the assembly 750, the thickness of the spacer elements (h) may be at least one-half of the minimum pitch (p) of an array of the solder elements 786 interconnecting the terminals 214 with corresponding pads of the external component 690.

In one embodiment, the package 752 has a thickness in the direction T such that the surface 720 is adjacent the surface 656 of the assembly 600' and, in some embodiments, at least partially contacts the surface 656 or is attached with an adhesive 790 to the surface 656.

In another embodiment, the microelectronic component 752 may be a microelectronic assembly or a microelectronic element, such as a semiconductor chip or a die severed from a semiconductor wafer. In some embodiments, a semiconductor chip may be connected to the structure 200 in the region 230 in a flip-chip orientation, such as shown in FIG. 11. In another embodiment, a semiconductor chip may be connected to the structure 200 in the region 230 by wirebond.

In another embodiment, referring to FIG. 15, a package assembly 800 may include the assembly 600' joined with a microelectronic package 752', which is substantially identical in construction to the package 752. Like reference numbers are used to describe elements of the package 752' identical to the elements of the package 752. In such embodiment, however, the assembly 600' is joined with the package 752' with the surface 710 of the package 752' facing the surface 656 of the package 600'. In addition, the surface 710 of the package 752' extends over a horizontal area not larger than the horizontal area defined by the bottom portion 506 of the receiving region 500 (see, for example, FIG. 7B or 7C), and the package 752' has a predetermined shape and a predetermined thickness in the direction T extending from the surface 710 to the surface 720, such that the terminals 712 at the surface 710 may be aligned in the thickness direction of the assembly 800 with pads of the conductive elements 194 or bottom portions 212' of the traces 212 of the assembly 600', and the terminals 214 of the package 600' may be aligned in the thickness direction of the assembly 800 with pads (not shown) on the surface 690 of the external component 690, and connected to the pads by solder elements 786, where the package 752 is within the region 502 without contacting the assembly 600' and extends in the thickness direction T between the surface 656 and the surface 692 of the component 690. Similarly as in the above embodiments, in the assembly 800, the thickness of the spacer elements (h) may be at least one-half of the minimum pitch (p) of an array of the solder elements 786 interconnecting the terminals 214 with pads of the external component 690. In some embodiments, the microelectronic element 714 may be a logic element, and the microelectronic element 702 may be a memory element. Also, similarly as in the above embodiments, a plurality of the assemblies 600' may be arranged in a stack, electrically interconnected with one another, over the component 690 and the package 752.

The assemblies discussed above can be utilized in construction of diverse electronic systems. For example, a system 900 (FIG. 16) in accordance with a further embodiment of the invention includes a first package assembly 902, such as the assembly 600, and a second package assembly 940, such as the assembly 650 including the packages 652 arranged in a stack on the assembly 650 as described above, and in conjunction with other electronic components 908 and 910. In the example depicted, component 908 is a semiconductor chip whereas component 910 is a display screen, but any other components can be used. Of course, although only two additional components are depicted in FIG. 16 for clarity of illustration, the system may include any number of such components. Package assemblies 902 and 904 and components 908 and 910 are mounted to a common housing 901, schematically depicted in broken lines, and are electrically interconnected with one another as necessary to form the desired circuit. In the exemplary system shown, the system includes a circuit panel 907 such as a flexible or rigid printed circuit board, and the circuit panel includes numerous conductors 909, of which only one is depicted in FIG. 16, interconnecting the components with one another. An off-board connector 911 connects component 910 to the circuit panel. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Again, the simplified system shown in FIG. 16 is merely exemplary; other systems, including systems commonly regarded as fixed structures, such as desktop computers, routers and the like can be made using the packages discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A structure comprising:
   a substrate having first and second oppositely facing surfaces, a plurality of electrically conductive elements at the first surface, and a plurality of first terminals at the second surface configured for connection to a first component, at least some of the first terminals electrically connected with the conductive elements;
   a spacer element overlying a first portion of the first surface, the spacer element having a third surface facing away from the first surface and an edge surface extending from the third surface towards the first surface;
   a plurality of second terminals overlying the third surface and overlying the first surface, the second terminals configured for connection to a second component; and
   a plurality of traces electrically coupled between the second terminals and at least one of the electrically conductive elements or the first terminals, the traces extending from the second terminals along the edge surface,
   wherein the spacer element at least partially defines a second portion of the first surface, the second portion being other than the first portion of the first surface and having an area sized to accommodate an entire area of a microelectronic element, and at least some of the conductive elements at the first surface are at the second portion and configured to permit connection with such microelectronic element.

2. The structure of claim 1, wherein the traces are at least partially uncovered.

3. The structure of claim 1, wherein the at least one of the conductive elements is configured for connection to at least one microelectronic element.

4. The structure of claim 3, wherein the at least one microelectronic element is part of a packaged assembly.

5. The structure of claim 1 further comprising:
   a dielectric layer covering the spacer element and at least a part of the first surface, the dielectric layer defining a fourth surface remote from and facing away from the first surface, at least a part of the fourth surface extending over the third surface, the dielectric layer further defining at least one second edge surface extending from a first border adjacent the fourth surface, along the at least one edge surface, to a second border adjacent the first surface,
   the traces extending from the second terminals along the fourth surface and along the second edge surface.

6. The structure of claim 5, wherein a surface of the dielectric layer extending from the fourth surface to the second edge surface extends a distance in a direction from the fourth surface to the second edge surface that is greater than a distance a surface of the spacer element extends in a direction from the third surface to the edge surface.

7. The structure of claim 1, wherein the spacer element is attached to the first surface.

8. The structure of claim 1, wherein the spacer element is molded on the first surface.

9. The structure of claim 1, wherein the spacer element includes at least one passive element electrically connected to at least one of the conductive elements at the first surface.

10. The structure of claim 1 further comprising:
    a plurality of the spacer elements laterally spaced from each other on the first surface and defining the second portion.

11. The structure of claim 10, wherein at least one of the spacer elements includes at least one passive element electrically connected to at least one of the conductive elements at the substrate.

12. The structure of claim 1, wherein the spacer element includes metal material.

13. The structure of claim 1, wherein the spacer element is a second substrate.

14. A package assembly including a structure of claim 1 and further comprising:
    a microelectronic element disposed over the second portion and electrically connected to at least some of the conductive elements; and
    a dielectric mass covering the microelectronic element and at least a part of the second portion, the dielectric mass defining a fourth surface remote from and facing away from the first surface, at least a part of the fourth surface extending over the first microelectronic element and the second portion toward the first spacer element, the dielectric mass defining a second edge surface facing at least a part of the edge surface, and some of the traces extending between the edge surface of the spacer element and the second edge surface.

15. The package assembly of claim 14, wherein at least a portion of the traces extending between the edge surface of the spacer element and the second edge surface are at least partially covered by solder mask.

16. The package assembly of claim 14, wherein a thickness of the spacer element in a thickness direction of the assembly is less than a thickness of the microelectronic element in the thickness direction.

17. The assembly of claim 14 further comprising:
    a microelectronic package including a second substrate having fifth and sixth oppositely facing surfaces, a second microelectronic element disposed over the sixth surface, second electrically conductive elements on the second substrate, the second conductive elements including third terminals at the fifth surface, the second microelectronic element being electrically connected to at least some of the second conductive elements,
    wherein the fifth surface faces the first surface and the third terminals of the microelectronic package at the fifth surface are electrically connected by respective solder elements to the second terminals of the structure.

18. The assembly of claim 17, wherein the solder elements include solder balls.

19. The assembly of claim 17, wherein the solder elements are flat at surfaces facing at least one of the third terminals of the microelectronic package or the second terminals of the structure.

20. The assembly of claim 17, wherein the third terminals of the microelectronic package are aligned in a thickness direction of the assembly with the second terminals of the structure.

21. The assembly of claim 17, wherein the solder elements are arranged in an array having a predetermined minimum pitch and wherein a distance in a thickness direction of the assembly from the third surface to the first surface is greater than one-half of the predetermined minimum pitch.

22. The assembly of claim 17, wherein the microelectronic element is a logic chip and the second microelectronic element is a memory chip.

23. The structure of claim 1, wherein the spacer element further defines a flange surface remote and facing away from the first surface and extending away from the edge surface adjacent the first surface of the first substrate, the flange surface being disposed at a distance in a direction of a thickness of the structure less than a distance in the direction of the thickness between the first surface and the third surface, wherein the traces have portions extending along the flange surface and being electrically connected to the conductive elements of the substrate.

24. The structure of claim 1, wherein the spacer element includes a plurality of the edge surfaces and the traces extend continuously from the second terminals overlying the third surface in the direction of the first surface over the plurality of the edge surfaces.

25. The structure of claim 1, wherein the substrate includes silicon or a material having a maximum coefficient of thermal expansion of 12.

26. A method of making a package assembly by joining a structure of claim 1 with a microelectronic element disposed over the second portion of the first surface of the substrate, and electrically connecting the microelectronic element to the conductive elements.

27. The structure of claim 1, wherein the spacer element is an overmold.

28. A structure comprising:
  a substrate having first and second oppositely facing surfaces, and a plurality of electrically conductive elements at the first surface;
  a spacer element overlying a first portion of the second surface and having a third surface facing away from the second surface of the substrate and an edge surface extending from the third surface towards the second surface;
  a plurality of terminals overlying the third surface and overlying the second surface of the substrate, the terminals configured for connection to a component; and
  a plurality of traces electrically coupled between the terminals and the conductive elements, the traces extending from the terminals along the edge surfaces,
  wherein the spacer element at least partially defines a second portion of the second surface, the second portion being other than the first portion of the second surface and having an area sized to accommodate an entire area of a microelectronic element.

29. A package assembly including a structure of claim 28 and further comprising:
  a microelectronic element disposed over the first surface and electrically connected to at least some of the conductive elements; and
  a dielectric mass covering the microelectronic element and at least a part of the first surface extending away from the microelectronic element.

30. The assembly of claim 29 further comprising:
  a microelectronic package including a second substrate having fourth and fifth oppositely facing surfaces, a second microelectronic element disposed over the fourth surface, second electrically conductive elements on the second substrate, the second conductive elements including second terminals at the fourth surface, the second microelectronic element being electrically connected to at least some of the second conductive elements,
  wherein the fourth surface faces the second surface, the second microelectronic element overlies the second portion of the second surface, and the terminals of the structure are electrically connected by respective solder elements to the second terminals of the microelectronic package at the fourth surface.

31. The assembly of claim 30, wherein the solder elements are arranged in an array having a predetermined minimum pitch and wherein a distance in a thickness direction of the assembly from the third surface to the second surface is greater than one-half of the predetermined minimum pitch.

32. The assembly of claim 30, wherein the first microelectronic element is a memory chip and the second microelectronic element is a logic chip.

33. The assembly of claim 29 further comprising:
  a microelectronic package including a second substrate having oppositely facing fourth and fifth surfaces, a second microelectronic element disposed over the fourth surface, second electrically conductive elements on the second substrate, the second conductive elements including second terminals at the fifth surface of the second substrate,
  wherein the second microelectronic element is over the second portion of the second surface and electrically connected to the microelectronic element of the structure through conductive elements of an external component to which the second terminals of the microelectronic package and the terminals of the structure are electrically connected.

34. The assembly of claim 33,
  wherein the external component is a third substrate and the conductive elements of the third substrate include third terminals at a sixth surface thereof and third traces extending from the third terminals at the sixth surface, wherein the second microelectronic element is electrically connected to the microelectronic element through the third terminals at the sixth surface soldered to at least one of the terminals at the third surface or the second terminals at the fifth surface.

35. The assembly of claim 29 further comprising:
  a microelectronic package including a second substrate having oppositely facing fourth and fifth surfaces, a second microelectronic element disposed over the fifth surface, second electrically conductive elements on the second substrate, the second conductive elements including second terminals at the fourth surface,
  wherein the second microelectronic element overlies the second portion of the second surface, and
  wherein the second terminals at the fourth surface are electrically connected to at least some of the conductive elements at the first surface.

36. A package assembly comprising:
  a structure comprising:
  a substrate having first and second oppositely facing surfaces, a plurality of electrically conductive elements at the first surface and a plurality of first terminals at the second surface configured for connection to a first component, at least some of the first terminals electrically connected with the conductive elements;
  a first dielectric mass disposed over a first portion of the first surface, the first dielectric mass having a third surface facing away from the first surface and a first edge surface extending from the third surface towards the first surface;
  a plurality of second terminals overlying the third surface and the first surface, the second terminals configured for connection to a second component; and
  a plurality of traces electrically coupled between the second terminals and at least one of the electrically conductive elements or the first terminals, the traces extending from the second terminals along the first edge surface,
  wherein the first dielectric mass at least partially defines a second portion of the first surface, the second portion being other than the first portion of the first surface and having an area sized to accommodate an entire area of a microelectronic element, and
  a second dielectric mass overlying at least a part of the second portion of the first surface, the second dielectric mass having a fourth surface remote from and facing away from the first surface, at least a part of the fourth surface extending over the second portion of the first surface toward the first dielectric mass, the second dielectric mass having a second edge surface facing at least a part of the first edge surface, and the first traces extending between the first and second edge surfaces, wherein the second dielectric mass is other than the first dielectric mass.

37. The package assembly of claim 36, wherein at least a portion of the first traces extending between the first and second edge surfaces are at least partially covered by solder mask.

* * * * *